US012808918B2

(12) United States Patent
Compton et al.

(10) Patent No.: US 12,808,918 B2
(45) Date of Patent: Nov. 24, 2026

(54) FAULT DETECTION SYSTEM AND POWER DISTRIBUTION SYSTEM HAVING SAME

(71) Applicant: GE Aviation Systems Limited, Cheltenham (GB)

(72) Inventors: Russell Mark Compton, Droitwich (GB); Ross Jonathan Williams, Cheltenham (GB); Luke Patrick Bolton, Cheltenham (GB)

(73) Assignee: GE Aviation Systems Limited, Cheltenham (GB)

( * ) Notice: Subject to any disclaimer, the term of this patent is extended or adjusted under 35 U.S.C. 154(b) by 214 days.

(21) Appl. No.: 18/476,893

(22) Filed: Sep. 28, 2023

(65) Prior Publication Data

US 2025/0110167 A1 Apr. 3, 2025

(51) Int. Cl.

| | |
|---|---|
| ***G01R 31/08*** | (2020.01) |
| ***G01R 31/58*** | (2020.01) |
| ***H02J 13/12*** | (2026.01) |
| *H02J 105/30* | (2026.01) |

(52) U.S. Cl.

CPC ........... *G01R 31/085* (2013.01); *G01R 31/58* (2020.01); *H02J 13/12* (2026.01); *H02J 2105/32* (2026.01)

(58) Field of Classification Search

CPC .... G01R 31/085; G01R 31/58; G01R 31/008; G01R 31/083; G01R 31/1218; H02J 13/00002; H02J 2310/44

See application file for complete search history.

(56) References Cited

U.S. PATENT DOCUMENTS

| | | | | |
|---|---|---|---|---|
| 5,184,081 | A | 2/1993 | Oswald | |
| 5,365,175 | A * | 11/1994 | Patterson | G01R 31/085 324/501 |
| 5,910,872 | A | 6/1999 | Marmonier et al. | |
| 6,229,680 | B1 | 5/2001 | Shea | |
| 7,035,068 | B2 | 4/2006 | Shea | |
| 7,580,232 | B2 | 8/2009 | Caggiano et al. | |
| 7,965,486 | B2 | 6/2011 | Land, III | |
| 8,022,711 | B2 | 9/2011 | Oldenburg et al. | |
| 8,319,173 | B2 | 11/2012 | Schweitzer, III et al. | |
| 8,576,521 | B2 | 11/2013 | Rodgers et al. | |
| 10,601,218 | B2 * | 3/2020 | Radun | H02H 3/207 |
| 10,983,155 | B2 | 4/2021 | Collins et al. | |
| 2005/0134837 | A1 * | 6/2005 | Sarkozi | G01N 21/67 356/73.1 |
| 2013/0286515 | A1 * | 10/2013 | White | H02H 3/0935 361/42 |
| 2016/0139196 | A1 * | 5/2016 | Hoff | G01R 31/1218 356/73.1 |

(Continued)

FOREIGN PATENT DOCUMENTS

| | | | | |
|---|---|---|---|---|
| EP | 0448293 A1 | 9/1991 | | |
| KR | 102026452 B1 * | 9/2019 | | G01R 31/1218 |

*Primary Examiner* — Feba Pothen

(74) *Attorney, Agent, or Firm* — Thomas | Horstemeyer, LLP

(57) ABSTRACT

A fault detection system for detecting an electrical fault in a component includes an optical conductor with a first end and a second end, and configured to optically face the component. A first sensor and a second sensor can be operably coupled to the first end and the second end, respectively. The first sensor and the second sensor are each configured to detect electromagnetic radiation propagating through the optical conductor.

20 Claims, 10 Drawing Sheets

(56) References Cited

U.S. PATENT DOCUMENTS

| | | | | |
|---|---|---|---|---|
| 2020/0116776 | A1 | 4/2020 | Ismail | |
| 2021/0018550 | A1 | 1/2021 | Severns | |
| 2021/0341547 | A1 * | 11/2021 | Bagga | G01R 31/52 |
| 2023/0213570 | A1 * | 7/2023 | Chamoun | G02B 6/4286<br>324/512 |

* cited by examiner

FAULT DETECTION SYSTEM AND POWER DISTRIBUTION SYSTEM HAVING SAME

TECHNICAL FIELD

The disclosure relates to a fault detection system, and more specifically toward indication of an electrical characteristic in a fault detection system.

BACKGROUND

Electrical power systems, such as those found in an aircraft power distribution system, employ power generating systems or power sources, such as generators, for generating electricity for powering the systems and subsystems of the aircraft. As the electricity traverses electrical bus bars to deliver power from power sources to electrical loads, power distribution nodes dispersed throughout the power system ensure the power delivered to the electrical loads meets the designed power criteria for the loads. Power distribution nodes can, for instance, further provide switching operations to selectively enable or disable the delivery of power to particular electrical loads, depending on, for example, available power distribution supply, criticality of electrical load functionality, or aircraft mode of operation, such as take-off, cruise, or ground operations.

In the event of an electrical fault in a power distribution system component, such as may occur in a bus bar, supply wire, or the like, large currents can spontaneously flow through a normally nonconductive medium, such as air. Such electrical faults can have unexpected or unpredictable effects on the power distribution assembly, including temperature changes, signal errors, or power fluctuations.

BRIEF DESCRIPTION OF THE DRAWINGS

A full and enabling disclosure of the present description, including the best mode thereof, directed to one of ordinary skill in the art, is set forth in the specification, which makes reference to the appended figures, in which.

DETAILED DESCRIPTION

Figure 1:
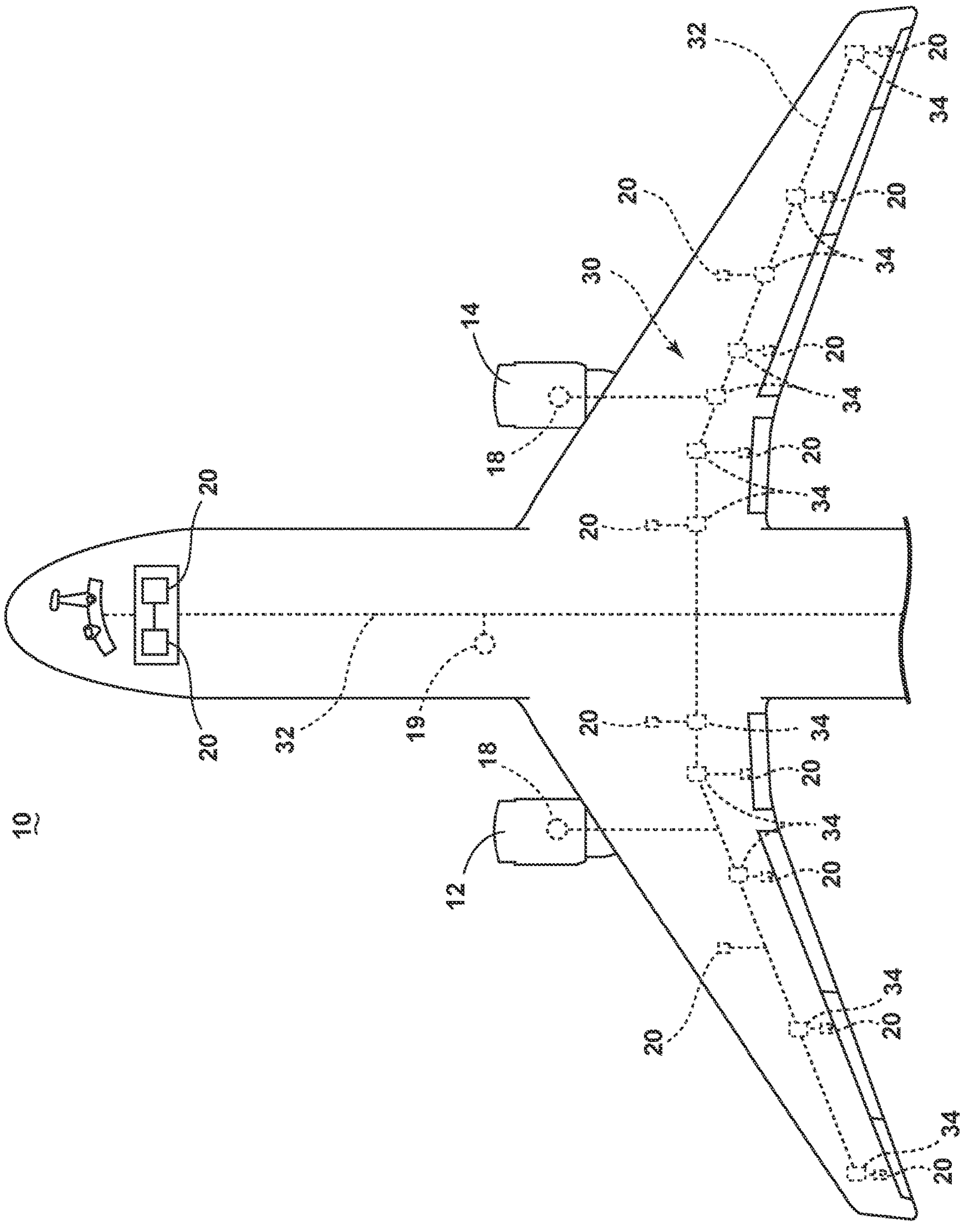
FIG. 1 is a top-down schematic view of an aircraft with a power distribution system in accordance with various aspects described herein.

Aspects of the present disclosure are described herein in the context of a fault detection system and power system in an aircraft. Aircraft power systems enable production and distribution of electrical power from an energy source such as a turbine engine, jet fuel, hydrogen, batteries, etc. However, it will be understood that the disclosure is not so limited and has general applicability to non-aircraft applications, including other mobile applications and non-mobile industrial, commercial, and residential applications. For example, some applicable mobile environments can include an aircraft, spacecraft, space-launch vehicle, satellite, locomotive, automobile, etc. Commercial environments can include manufacturing facilities or power generation and distribution facilities or infrastructure.

During power system operation, including aircraft power distribution systems as one example, electrical components such as wiring, switches, nodes, or the like can carry large or variable currents that may produce electrical faults, including arc faults or arc flashes. Such electrical faults can produce significant heat and light, which can lead to undesirable effects on surrounding components such as insulation, housings, connectors, cable strands, or the like. Arc fault detection (AFD) systems can be provided wherein one or more sensors monitor electric components for the presence of electrical faults. Such AFD systems can be incorporated into the power distribution system in some examples, or provided as a standalone system in some examples. Traditional AFD systems can provide a broad indication of the fault, such as a “fault detected” or “no faults detected” indicator, or an indication of which circuit has been affected by the arc fault. However, such systems do not provide detailed information toward locating the arc fault along or within the component. In large and/or dense power systems such as those found in an aircraft environment, even circuit-level indication of the electrical fault can lead to a large number of components being selected for inspection or maintenance activity.

Aspects of the disclosure provide for a fault detection system capable of detecting an arc fault in a component, and also providing a location of the arc fault within or along the component. The fault detection system described herein includes an optical conductor with two ends, such as a fiber optic cable, and an optical sensor positioned at each end for detection of electromagnetic (EM) radiation propagating through the optical conductor. The optical conductor is arranged along an optical path with an electrical component, e.g. a supply wire or other current-carrying component. A controller module can receive signals from the sensors indicative of an EM pulse that is incident on the optical conductor, such as may occur due to an electrical fault within the electrical component. A time delay can be present between sensor detection of the EM pulse at each end. The controller module can determine at least one of a location of the incident EM pulse on the optical conductor, or a location of the arc fault in the electrical component, based at least on the time delay.

As used herein, the term “set” or “a set” of elements can be any number of elements, including only one. As used herein, the term "upstream" can refer to a direction that is opposite the electrical, power, or current flow direction, and the term "downstream" can refer to a direction that is in the same direction as the electrical, power, or current flow direction.

Also, as used herein, while sensors can be described as "sensing" or "measuring" a respective value, sensing or measuring can include determining a value indicative of or related to the respective value, rather than directly sensing or measuring the value itself. The sensed or measured values can further be provided to additional components. For instance, the value can be provided to a controller module or processor, and the controller module or processor can perform processing on the value to determine a representative value or an electrical characteristic representative of said value.

Additionally, while terms such as "voltage", "current", and "power" can be used herein, it will be evident to one skilled in the art that these terms can be interrelated when describing aspects of the electrical circuit, or circuit operations.

All directional references (e.g., radial, axial, upper, lower, upward, downward, left, right, lateral, front, back, top, bottom, above, below, vertical, horizontal, clockwise, counterclockwise) are only used for identification purposes to aid the reader's understanding of the disclosure, and do not create limitations, particularly as to the position, orientation, or use thereof. Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to each other. In non-limiting examples, connections or disconnections can be selectively configured to provide, enable, disable, or the like, an electrical connection between respective elements. Non-limiting exemplary power distribution bus connections or disconnections can be enabled or operated by way of switching, bus tie logic, or any other connectors configured to enable or disable the energizing of electrical loads downstream of the bus. Additionally, as used herein, "electrical connection" or "electrically coupled" can include a wired or wireless connection. The exemplary drawings are for purposes of illustration only and the dimensions, positions, order and relative sizes reflected in the drawings attached hereto can vary.

Additionally, as used herein, a "controller" or "controller module" can include a component configured or adapted to provide instruction, control, operation, or any form of communication for operable components to effect the operation thereof. A controller module can include any known processor, microcontroller, or logic device, including, but not limited to: field programmable gate arrays (FPGA), an application specific integrated circuit (ASIC), a full authority digital engine control (FADEC), a proportional controller (P), a proportional integral controller (PI), a proportional derivative controller (PD), a proportional integral derivative controller (PID controller), a hardware-accelerated logic controller (e.g. for encoding, decoding, transcoding, etc.), the like, or a combination thereof. Non-limiting examples of a controller module can be configured or adapted to run, operate, or otherwise execute program code to effect operational or functional outcomes, including carrying out various methods, functionality, processing tasks, calculations, comparisons, sensing or measuring of values, or the like, to enable or achieve the technical operations or operations described herein. The operation or functional outcomes can be based on one or more inputs, stored data values, sensed or measured values, true or false indications, or the like. While "program code" is described, non-limiting examples of operable or executable instruction sets can include routines, programs, objects, components, data structures, algorithms, etc., that have the technical effect of performing particular tasks or implement particular abstract data types. In another non-limiting example, a controller module can also include a data storage component accessible by the processor, including memory, whether transient, non-transient, volatile, or non-volatile memory. Machine-executable instructions, associated data structures, and program modules represent examples of program code for executing methods disclosed herein. Machine-executable instructions can include, for example, instructions and data, which cause a general purpose computer, special purpose computer, or special purpose processing machine to perform a certain function or group of functions.

Additional non-limiting examples of the memory can include Random Access Memory (RAM), Read-Only Memory (ROM), flash memory, or one or more different types of portable electronic memory, such as discs, DVDs, CD-ROMs, flash drives, universal serial bus (USB) drives, the like, or any suitable combination of these types of memory. In one example, the program code can be stored within the memory in a machine-readable format accessible by the processor. Additionally, the memory can store various data, data types, sensed or measured data values, inputs, generated or processed data, or the like, accessible by the processor in providing instruction, control, or operation to effect a functional or operable outcome, as described herein. In another non-limiting example, a controller module can include comparing a first value with a second value, and operating or controlling operations of additional components based on the satisfying of that comparison. For example, when a sensed, measured, or provided value is compared with another value or range, including a stored or predetermined value or range, the satisfaction of that comparison can result in actions, functions, or operations controllable by the controller module. As used herein, the term "satisfies" or "satisfaction" of a comparison between a first value and a second value can refer to a determination of whether the first value exceeds the second value, or does not exceed the second value, or is equal to the second value, such that the comparison is "true" when satisfied. In addition, as used herein, the term "satisfies" or "satisfaction" of a comparison between a first value and a value range refers to a determination that the first value is within the value range, such that the comparison is "true" when satisfied. It will be understood that such a determination may easily be altered to be satisfied by a positive/negative comparison or a true/false comparison. Example comparisons can include comparing a sensed or measured value to a threshold value or threshold value range.

As used herein, a controllable switching element, or a "switch," is an electrical device that can be controllable to toggle between a first mode of operation or first mode, wherein the switch is "closed" intending to transmit current from a switch input to a switch output, and a second mode of operation or second mode, wherein the switch is "open" intending to prevent current from transmitting between the switch input and switch output. In non-limiting examples, connections or disconnections, such as connections enabled or disabled by the controllable switching element, can be selectively configured to provide, enable, disable, or the like, an electrical connection between respective elements.

The disclosure can be implemented in any electrical circuit environment having a switch. A non-limiting example of an electrical circuit environment that can include aspects of the disclosure can include an aircraft power system architecture, which enables production of electrical power from at least one spool of a turbine engine, such as a gas turbine engine, and delivers the electrical power to a set of electrical loads via at least one switch. One exemplary implementation can include a solid state power controller (SSPC) switching device, such as a silicon, silicon carbide (SiC) or Gallium Nitride (GaN) based, high power switch, in non-limiting examples. SiC or GaN can be selected based on their solid state material construction, their ability to handle high voltages and large power levels in smaller and lighter form factors, and their high speed switching ability to perform electrical operations very quickly. Another exemplary implementation can include a field-effect transistor (FET) switch, such as a metal-oxide-semiconductor field effect transistor (MOSFET) switch, which can be controlled by an applied voltage on the switch. Additional switching devices or additional silicon-based power switches can be included.

Referring now to FIG. 1, an aircraft 10 is shown having at least one turbine engine, shown as a left engine system 12 and a right engine system 14. The aircraft 10 can have fewer or additional engine systems, including only one, or three or more. The left and right engine systems 12, 14 can be identical engine systems in some implementations.

The aircraft 10 can include at least one power source 18, such as a generator, an electric machine, a battery power source, or the like, or combinations thereof. The at least one power source can supply either or both of AC power or DC power. In the non-limiting example shown, the left and right engine systems 12, 14 each include a power source 18 in the form of a generator configured to supply at least AC power. A second power source 19 can also be provided in some exemplary implementations. In the non-limiting example shown, the second power source 19 is provided within the aircraft 10 and externally of the left and right engine systems 12, 14 though this need not be the case. For instance, in one non-limiting example, either or both of the left engine system 12 or the right engine system 14 can include a second generator, electric machine, battery power source, or the like. In another non-limiting example, the left engine system 12 can include the first power source 18 (e.g. the generator) as a primary power source, and also a second generator as a secondary, back-up, or redundant power source. In still another non-limiting example, the second power source 19 can include a set of supplemental power sources provided and operable to provide at least a portion of primary power, supplemental power, redundant power, backup power, emergency power, or the like. Non-limiting examples of such supplemental power sources can include, but are not limited to, dischargeable or rechargeable sources of electrical energy, such as fuel cells, batteries, capacitors, supercapacitors, energy source "banks" of a set of devices, or any other source of electrical power.

The aircraft 10 can also include power-consuming components or electrical loads 20, such as for instance, an actuator load, flight critical loads, or non-flight critical loads. The electrical loads 20 can be located anywhere inside the aircraft 10.

An exemplary power distribution system 30 is provided for electrically coupling the electrical loads 20 with at least one of the power sources 18 or the second power source 19. The exemplary power distribution system 30 can include, for instance, a power distribution bus or power bus 32, such as a power transmission line or bus bar in non-limiting examples. In some implementations wherein one or more supplemental power sources as described above are provided, such supplemental power sources can be selectably connectable with the power bus 32, or with one or more of the electrical loads 20.

One or more power distribution nodes 34 are also provided in the power distribution system 30. The power distribution nodes 34 can receive power from any or all of the power source 18, the second power source 19, or the power bus 32.

The power distribution nodes 34 can also be electrically coupled to one or more of the electrical loads 20. The power distribution nodes 34 can be configured to receive power, store power, supply power, transfer power, convert power, modify a power characteristic, or the like, or combinations thereof. Some non-limiting examples of power distribution nodes 34 that can be provided in the power distribution system 30 include: a power transformer, such as a main power transformer (MPT), a unit auxiliary transformer (UAT), or a reserve auxiliary transformer (RAT); a primary power distribution unit (PDU); a power transfer control unit (PTCU); or a power converter, such as a DC-to-DC converter, an AC-to-DC converter, or an AC-to-AC converter. In this manner, the power distribution system 30 can form at least part of an avionics system for the aircraft 10.

During typical operations of the aircraft 10, the operating left and right engine systems 12, 14 provide mechanical energy which can be extracted, typically via a spool, to provide a driving force for the one or more power sources 18 (e.g. generators). The power sources 18, in turn, generate power, such as AC or DC power, and provide the generated power to the power bus 32, which delivers the power to the electrical loads 20 positioned throughout the aircraft 10. Furthermore, during typical operations of the aircraft 10, the second power source 19 (e.g. one or more supplemental power sources as described above) can be selectably connected with the power bus 32 and operable to provide primary or supplemental power to a subset of the electrical loads 20 as described above.

Example power distribution management functions can include, but are not limited to, selectively enabling or disabling the delivery of power to particular electrical loads 20, depending on, for example, available power distribution supply, criticality of electrical load 20 functionality, or aircraft mode of operation, such as take-off, cruise, or ground operations. During emergency or inadequate periods of electrical power generation, including but not limited to engine or generator failure, at least one of the supplemental power sources can be operated, enabled, or connected for providing power to the electrical loads 20. Additional management functions can be included.

It will be understood that while aspects of the disclosure are shown in an aircraft environment of FIG. 1, the disclosure is not so limited and can have applicability in a variety of environments. For example, aspects of the disclosure can be applicable for providing power, supplemental power, emergency power, essential power, or the like, for other power system architectures, including in other mobile environments or stationary environments.

Furthermore, the number of, and placement of, the various components depicted in FIG. 1 are also non-limiting examples of aspects associated with the disclosure. For example, while various components have been illustrated with relative position of the aircraft 10 (e.g. the electrical loads 20 on the wings of the aircraft 10, etc.), aspects of the disclosure are not so limited, and the components are not so limited based on their schematic depictions. Additional aircraft 10 configurations are envisioned.

Figure 2:
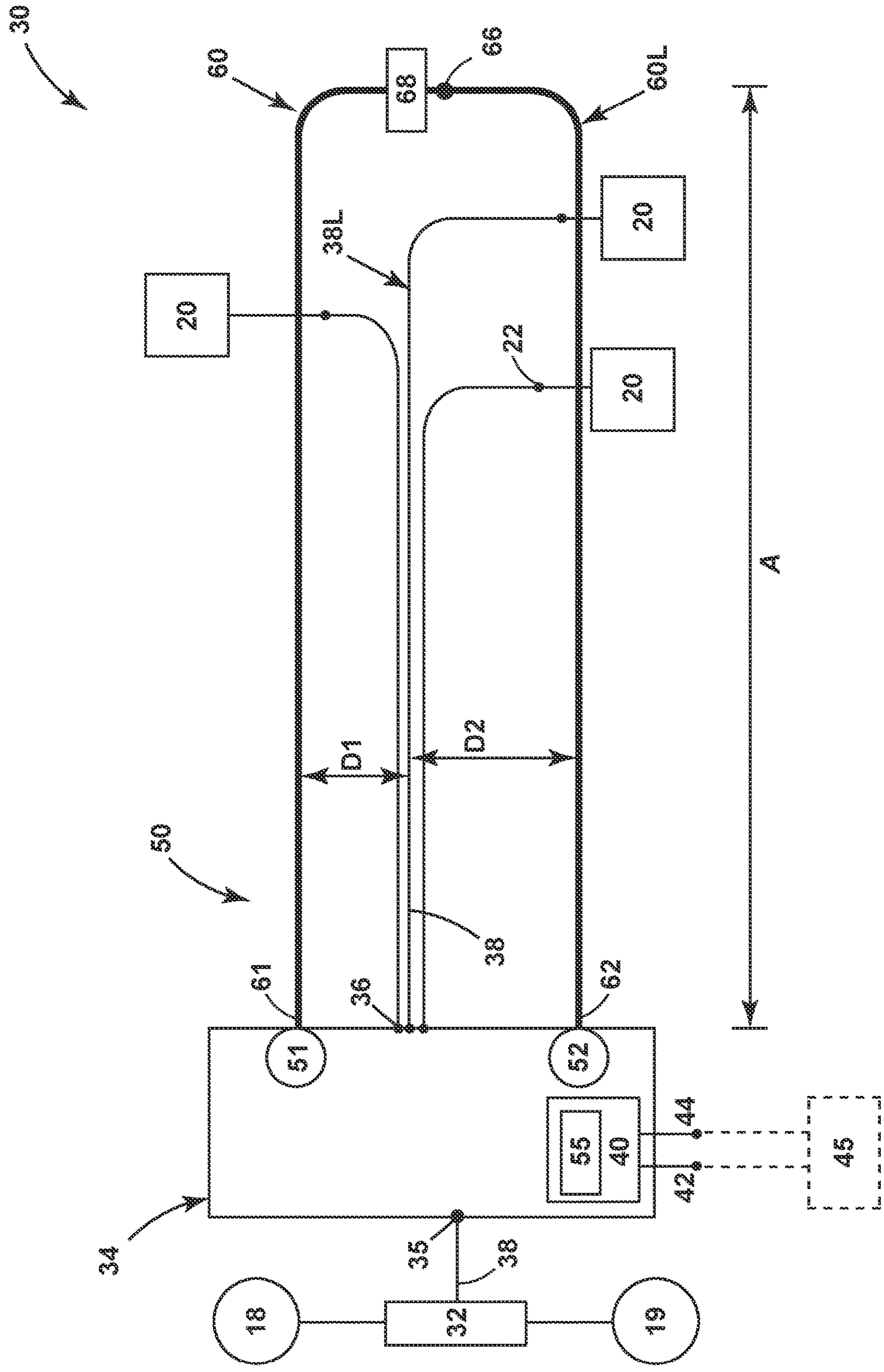
FIG. 2 is a schematic view a fault detection system that can be utilized in the power distribution system of FIG. 1 in accordance with various aspects described herein.

Referring now to FIG. 2, a schematic illustration is shown of one power distribution node (PDN) 34 in the power distribution system 30 in accordance with various aspects described herein. It is contemplated that the PDN 34 can be in the form of an MPT or a PDU in some exemplary implementations.

The PDN 34 can include at least one node input 35 and at least one node output 36. In the exemplary implementation shown, the PDN 34 includes a single node input 35 electrically coupled to the power bus 32, as well as multiple node outputs 36 each configured to supply power to corresponding electrical loads 20. Any number of node inputs 35 and node outputs 36 can be provided, including only one. In some implementations, one or more node outputs 36 can also be selectively connected with a secondary distribution node to define a hierarchical topography for the power distribution system 30.

Some exemplary supply wires 38 are shown electrically coupling the power bus 32 to the PDN 34, and also electrically coupling each node output 36 to the corresponding electrical load 20. In some implementations, the supply wires 38 can also be combined in a bundle including, but not limited to, a cable having a single connector at each end and multiple internal wires each extending between the single connectors, or a cable snake having multiple wires with separated wire ends, or multiple discrete wires secured by fasteners or sleeves, or the like. Some exemplary couplings 22 are also illustrated between the supply wires 38 and electrical loads 20. Such couplings 22 can include connectors, wire joins, plug ends, or the like. Furthermore, each supply wire 38 can define a wire length 38L between the corresponding node output 36 and coupling 22 as shown.

A power controller 40 is also provided in the power distribution system 30. In the non-limiting example shown, the power controller 40 is provided with the power distribution node 34 though this need not be the case. In some implementations, the power controller 40 can be a separate or discrete component and communicatively coupled to the PDN 34. The power controller 40 can include a processor and a machine-readable medium for carrying or having machine-executable instructions or data structures stored thereon. Such a machine-readable medium can be any available medium that can be accessed by a general purpose or special purpose computer or processor.

The power controller 40 can include at least one data input 42 and at least one data output 44. As shown, the data input 42 and data output 44 are illustrated as single, discrete components extending from the PDN 34 though this need not be the case. It should be understood that the data input 42 or the data output 44 can also be incorporated or implemented with one of the supply wires 38, such as a data-over-power network configuration, and need not be a separate input or output. The power controller 40 can also include multiple data inputs or multiple data outputs in some implementations. In addition, in the non-limiting example shown, a second controller 45 is communicatively coupled to the data input 42 and the data output 44. The second controller 45 can be any suitable controller module including a power controller for another PDN, a higher-level controller in the PDS 30, or a controller in another aircraft system such as a navigation system, environmental control system, or the like. In this manner, the power controller 40 can be in signal communication or controllable operation with an additional controller by way of the data input 42 and the data output 44.

The power controller 40 can be operably coupled to one or more node outputs 36. During operation, the power controller 40 can receive input data, sensor signals, parameters, or the like from the power distribution nodes 34 or other aircraft systems or controller modules at the data input 42, and selectively control operation of the PDN 34 to operably and selectively supply power to corresponding one or more electrical loads 20 based on the received input. In some examples, the power controller 40 can also transmit data to one or more systems by way of the data output 44, including to the second controller 45, to other components in the power distribution system 30, or to other aircraft systems or controller modules. In this manner, the power controller 40 can be configured to controllably operate the node output 36 for selectively supplying power to at least one electrical load 20.

As described above, the power bus 32 can be electrically coupled to the power source 18 for receiving and delivering power to the electrical loads 20. In the exemplary implementation shown, the second power source 19 is also provided and configured to supply power to the power bus 32. The second power source 19 can include a supplemental power unit, one or more batteries, an additional generator, or the like, as described above. It is also understood that any number, type, or combination of power sources can be utilized to supply power to the PDN 34, including a single power source, or three or more power sources. In addition, other elements not shown in FIG. 2 can nevertheless be provided in the power distribution system 30 or PDN 34, including additional switches, contactors, controllers, power sources, or the like, in non-limiting examples. In this manner, the PDN 34 can receive power from either or both of the power source 18 or the second power source 19, including simultaneously or asynchronously, and can also supply power to the one or more electrical loads 20 based on power needs, operating conditions, or other parameters.

A fault detection system 50 can be provided for detection of electrical faults in the power distribution system 30, including arc faults or flashes that may occur in the supply wires 38 during operation. As shown, the fault detection system 50 is configured to detect electrical faults in the supply wires 38 connecting the PDN 34 to the electrical loads 20. It will be understood that the fault detection system 50 can be configured to detect arc faults in any portion or component of the power distribution system 30, including in other supply wires, the power bus 32, one or more electrical loads 20, or the like.

The fault detection system 50 includes a first sensor 51 and a second sensor 52 each configured to detect electromagnetic (EM) radiation, including visible-spectrum radiation, infrared radiation, or ultraviolet radiation in some examples. The fault detection system 50 also includes a controller module 55 (also referred to herein as "controller 55") having a processor and a machine-readable medium for carrying or having machine-executable instructions or data structures stored thereon. Such a machine-readable medium can be any available medium that can be accessed by a general purpose or special purpose computer or processor, as described above.

The controller 55 is communicatively coupled with each of the first and second sensors 51, 52. In the non-limiting implementation shown, the controller module 55 is incorporated with the PDN 34 and includes the power controller 40. In such a case, it is contemplated that the controller module 55 and the power controller 40 can share a common machine-readable medium or a common processor, or utilize separate machine-readable media or separate processors. In this manner, the controller 55 can be configured to controllably operate the node output 36 for selectively supplying power to at least one electrical load 20. In another example, the controller 55 can be a discrete component and separated from the power controller 40. The fault detection system 50, including the controller 55, can also be implemented with discrete components separated from the PDN 34 in some implementations. Furthermore, the controller module 55 can include one or more data inputs and one or more data outputs for transmission of signals or controllable operation between the controller module 55 and other systems or components, such as the second controller 45. Regardless of whether the controller module 55 is incorporated with the PDN 34 or implemented as a separate component, it is contemplated that the controller 55 can be communicatively or controllably coupled to the node input 35, the node output(s) 36, the data input 42, or the data output 44.

The fault detection system 50 further includes an optical conductor 60 extending between a first end 61 and a second end 62. As used herein, "optical conductor 60" refers to a component having a suitable material, refractive index, or geometric profile for transmitting EM radiation between the first and second ends 61, 62 including, but not limited to, visible-spectrum radiation, infrared radiation, or ultraviolet radiation. Some non-limiting examples of optical conductors 60 include a fiber optic cable, a light pipe, a wave guide, or the like.

In the illustrated example, the optical conductor 60 is arranged with the first sensor 51 and the second sensor 52 operably coupled to the respective first end 61 and second end 62 of the optical conductor 60. The optical conductor 60 is configured to optically face one or more supply wires 38. As used herein, a first component "optically facing" a second component refers to the first component having at least one optical path to the second component. It will be understood that such an optical path between the first and second components can include, but is not limited to: a direct line of sight; a curved or folded optical path; one or more optical barriers; or one or more optical components such as mirrors, lenses, gratings, or the like. In some implementations, the optical conductor 60 can be configured to form a loop extending about at least a portion of the supply wires 38. Such a loop can also extend fully about, or fully encompass, any or all of the supply wires 38.

The optical conductor 60 can extend at least partially along an axial direction (denoted 'A' relative to the illustrated example). In the non-limiting example shown, the optical conductor 60 defines a midpoint 66, and the axial direction A is defined between the node output 36 and the midpoint 66, though this need not be the case. In some implementations, the axial direction A can be defined between the node output 36 and the coupling 22, or between the node output 36 and corresponding electrical load 20, in some non-limiting examples. It should be understood that the axial direction A can be the same or different for two or more of the supply wires 38.

The optical conductor 60 can define a conductor length 60L between the first and second ends 61, 62 as shown. The optical conductor 60 can also define a spacing distance with respect to one or more of the supply wires 38. As shown, a first spacing distance D1 and a second spacing distance D2 is defined with respect to one supply wire 38 though this need not be the case. The spacing distance can also include a shortest distance between one supply wire 38 and the optical conductor 60, or a list of individual spacing distances between the optical conductor 60 and each supply wire 38, or an average spacing distance between the optical conductor 60 and the supply wires 38, or the like, in some non-limiting examples. Furthermore, one or more spacing distances (e.g. the first and second spacing distances D1, D2) can also be stored in a memory of the controller 55.

An optical filter 68 can also be provided in the fault detection system 50. In the non-limiting implementation shown, the optical filter 68 is a discrete component operably coupled to the optical conductor 60 adjacent the midpoint 66, though this need not be the case. The optical filter 68 can include any or all of a thin-film interference filter, a bandpass filter, a coating over a portion of the optical conductor 60, a fiber Bragg grating within the optical conductor 60, or the like for removing ambient EM radiation that may enter the optical conductor 60 at one of the first or second ends 61, 62. It is contemplated that one or more optical filters 68 can be operably coupled to the optical conductor 60 at any location, including at the first end 61, the second end 62, or at least one location between the first and second ends 61, 62.

Figure 3:
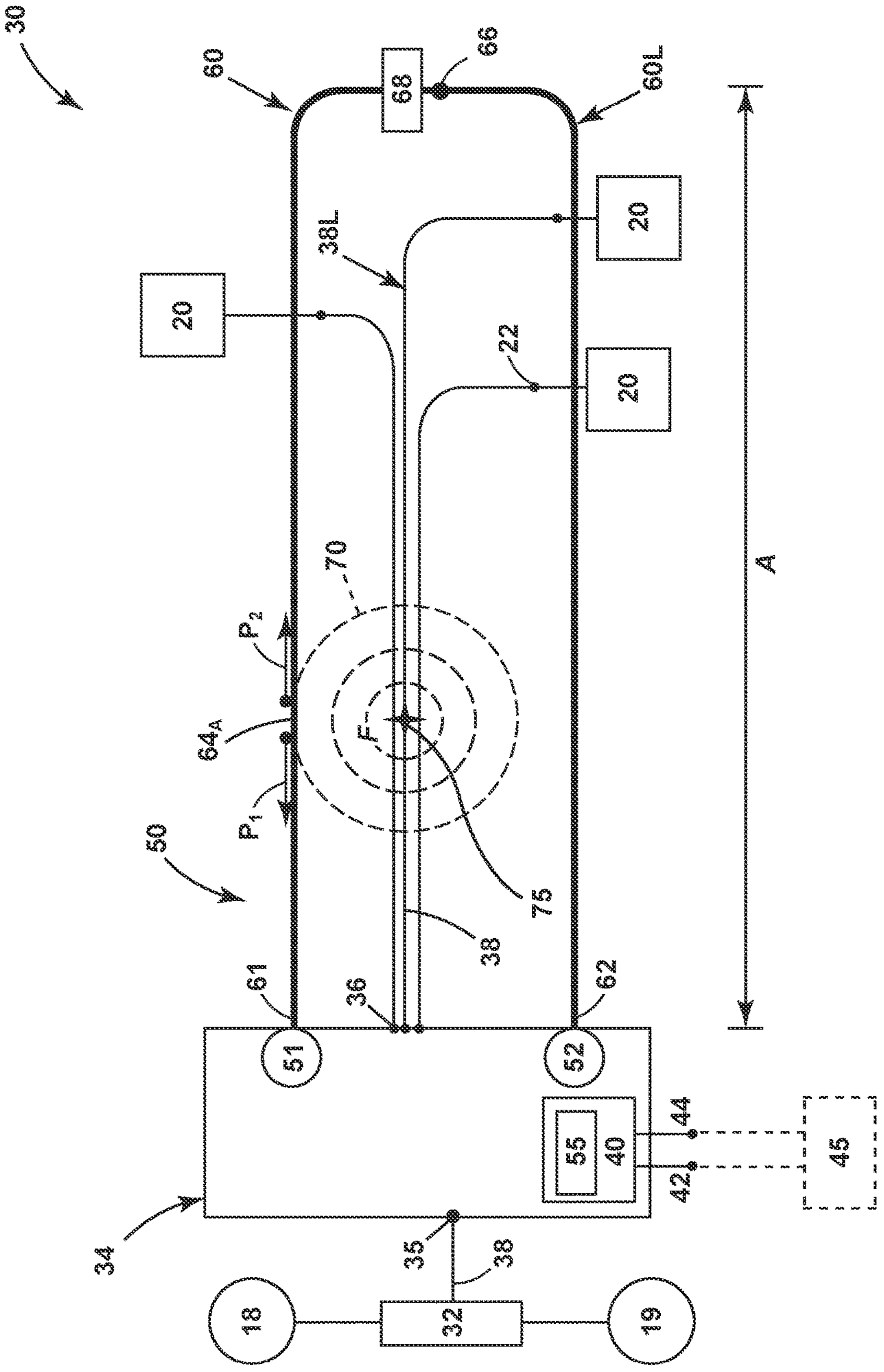
FIG. 3 is a schematic view of the fault detection system of FIG. 2 and illustrating an electrical fault generating an electromagnetic wave.

Referring now to FIG. 3, the fault detection system 50 and the power distribution system 30 are shown during one example of operation where an arc fault F (illustrated with a star) is present in one of the supply wires 38. The arc fault F generates an EM pulse 70, such as an arc flash, having a range of emitted EM frequencies including optical or ultraviolet. The EM pulse 70 propagates outward from a fault location 75 in the supply wire 38 as shown.

The EM pulse 70 is illustrated with concentric dashed circles each indicating an advancing wave front over time. The illustrated EM pulse 70 is truncated at the optical conductor 60 for visual clarity, and it is understood that the EM pulse 70 can continue outward propagation beyond the optical conductor 60. It should also be understood that the EM pulse 70 represents a time-limited, pulse-like emission from the fault location 75.

In the example shown, the EM pulse 70 is first incident on the optical conductor 60 at a first pulse location $\mathbf{64}_A$. As the EM pulse 70 encounters the optical conductor 60 at the first pulse location $\mathbf{64}_A$, a first portion $P_1$ of the EM pulse 70 propagates toward the first end 61 and a second portion $P_2$ propagates toward the second end 62. The first sensor 51 and the second sensor 52 can sense or detect the respective first portion $P_1$ and second portion $P_2$ of the EM pulse 70. The first and second sensors 51, 52 can transmit corresponding sensor signals, received by the controller 55, that are indicative of the EM pulse 70 propagating through the optical conductor 60 toward each end 61, 62.

In the illustrated example, the first pulse location $\mathbf{64}_A$ has a shorter distance along the optical conductor 60 to the first sensor 51 compared to the second sensor 52, leading to a time delay between sensor detection of the first and second portions $P_1$, $P_2$. Accordingly, the corresponding sensor signals transmitted by the first and second sensors 51, 52 can also have the same time delay between transmission.

Furthermore, the filter 68 can modify either or both of the first portion $P_1$ or the second portion $P_2$. In the illustrated example, the first portion $P_1$ is directed to the first sensor 51 without encountering the filter 68, and the second portion $P_2$ is directed through the filter 68 prior to encountering the second sensor 52. In this manner, the filter 68 can modify the second portion $P_2$ including, but not limited to, modifying a wave amplitude, a waveform, a phase, or a frequency composition of the second portion $P_2$.

Figure 4:
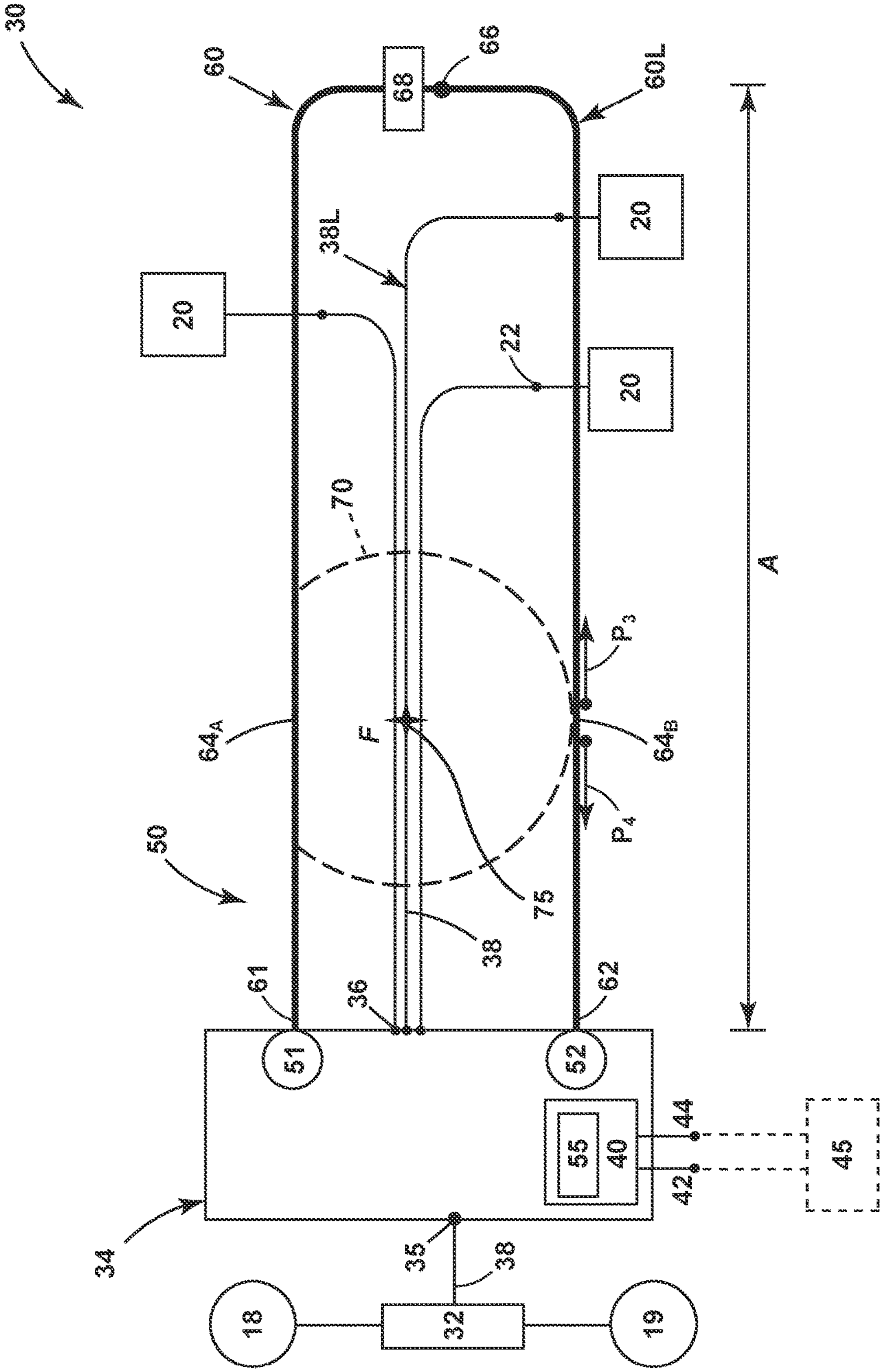
FIG. 4 is a schematic view of the fault detection system of FIG. 2 and illustrating propagation of the electromagnetic wave of FIG. 3.

Turning to FIG. 4, with continued propagation the EM pulse 70 is once again incident on the optical conductor 60 at a second pulse location $\mathbf{64}_B$. For clarity, the first pulse location $\mathbf{64}_A$ is also indicated. While the first and second pulse locations $\mathbf{64}_A$, $\mathbf{64}_B$ are illustrated on opposing sides of a symmetric optical conductor 60, it is contemplated that the optical conductor 60 can be arranged or positioned in a variety of ways, including in a symmetric, asymmetric, or irregular geometric profile. It is further contemplated that the EM pulse 70 can be incident on any portion or region of the optical conductor 60, including on a single portion only, or sequentially incident on multiple portions, or the like.

As the EM pulse 70 encounters the optical conductor 60 at the second pulse location $\mathbf{64}_B$, a third portion $P_3$ of the EM pulse 70 propagates toward the first end 61 and a fourth portion $P_4$ propagates toward the second end 62. The first sensor 51 and the second sensor 52 can sense or detect the respective third portion $P_3$ and fourth portion $P_4$. The first and second sensors 51, 52 can transmit corresponding sensor signals, received by the controller 55, that are indicative of the EM pulse 70 propagating through the optical conductor 60.

In addition, in the illustrated example, the second pulse location $\mathbf{64}_B$ has a shorter distance along the optical conductor 60 to the second sensor 52 compared to the first sensor 51, leading to a time delay between sensor detection of the third and fourth portions $P_3$, $P_4$. Accordingly, the corresponding sensor signals transmitted by the first and second sensors 51, 52 can also have the time delay between transmission.

Figure 5:
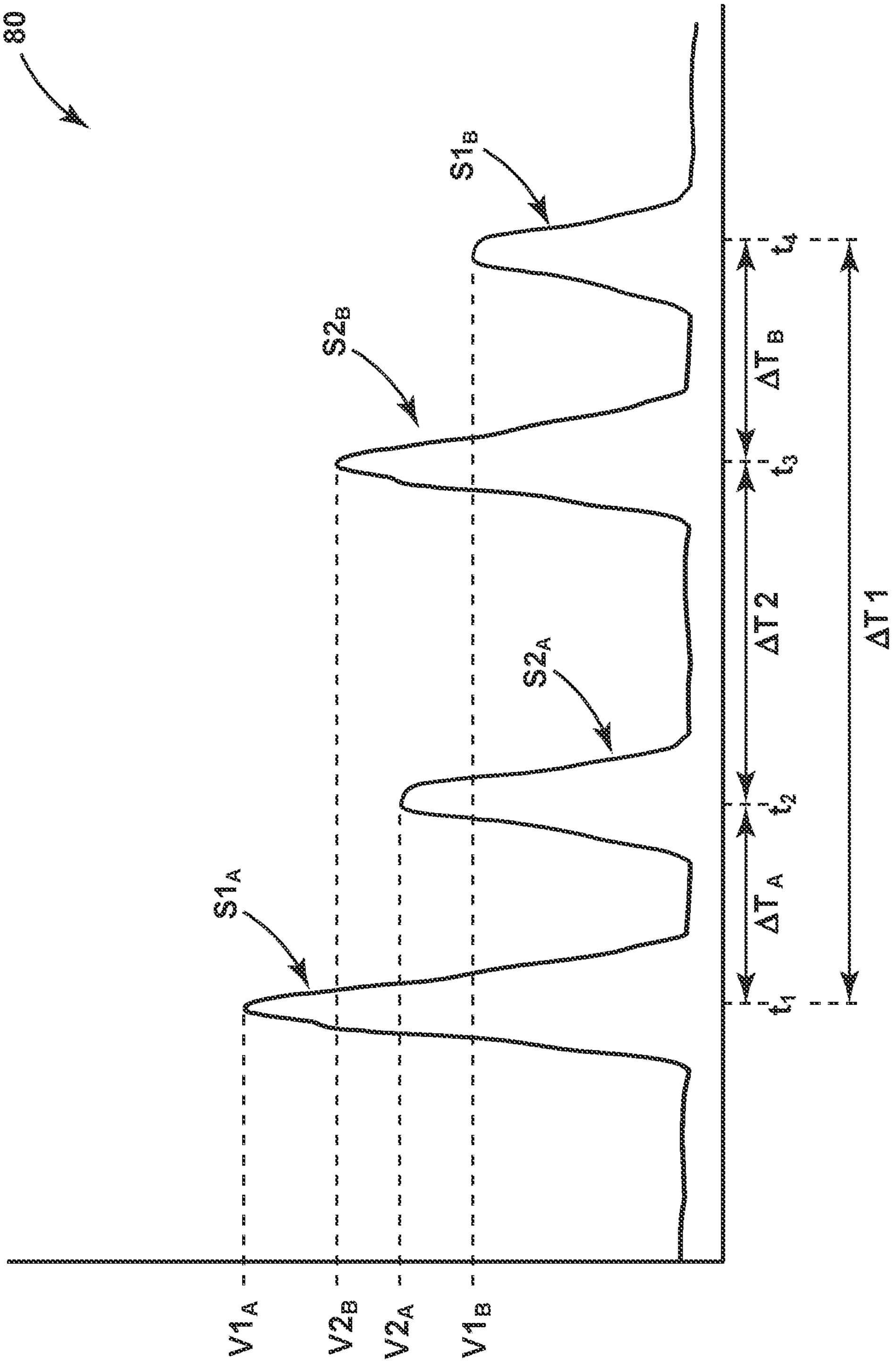
FIG. 5 is a plot illustrating sensor signals in the fault detection system of FIG. 2.

Referring now to FIG. 5, a plot 80 illustrates one non-limiting example of sensor signals received by the controller module 55 (FIG. 4) from the first and second sensors 51, 52. The plot 80 includes a first signal $S\mathbf{1}_A$ from the first sensor 51 and a second signal $S\mathbf{2}_A$ from the second sensor 52, each corresponding to the EM pulse 70 incident at the first pulse location $\mathbf{64}_A$ (FIG. 3). The plot 80 also includes a subsequent first signal SIB from the first sensor 51 and a subsequent second signal $S\mathbf{2}_B$ from the second sensor 52, each corresponding to the EM pulse 70 incident at the second pulse location $\mathbf{64}_B$ (FIG. 4).

The first and second signals $S\mathbf{1}_A$, $S\mathbf{2}_A$ are represented by a respective first voltage VIA and second voltage $V\mathbf{2}_A$. The subsequent first and second signals $S\mathbf{1}_B$, $S\mathbf{2}_B$ are represented by a respective subsequent first and second voltage $V\mathbf{1}_B$, $V\mathbf{2}_B$. Additionally or alternatively, the sensor signals $S\mathbf{1}_A$, $S\mathbf{2}_A$, $S\mathbf{1}_B$, $S\mathbf{2}_B$ can be in the form of a voltage or current, including a single value, a maximum or a minimum value, an amplitude, a change or delta, or a rate of change, in some non-limiting examples.

More particularly, the first signal $S\mathbf{1}_A$ and the second signal $S\mathbf{2}_A$ correspond to detection of the first portion $P_1$ and the second portion $P_2$ (FIG. 3), respectively. The subsequent first and second signals $S\mathbf{1}_B$, $S\mathbf{2}_B$ correspond to detection of the third portion $P_3$ and the fourth portion $P_4$ (FIG. 4), respectively.

In the example shown, the controller 55 sequentially receives the signals $S\mathbf{1}_A$, $S\mathbf{2}_A$, $S\mathbf{2}_B$, $S\mathbf{1}_B$ at respective times $t_1$, $t_2$, $t_3$, $t_4$. As described above, the first portion $P_1$ (FIG. 3) travels a shorter distance through the optical conductor 60 compared to the second portion $P_2$, leading to a time delay $\Delta T_A$ between the corresponding first and second sensor signals $S\mathbf{1}_A$, $S\mathbf{2}_A$. Additionally, the third portion $P_3$ (FIG. 4) travels a shorter distance through the optical conductor 60 compared to the fourth portion $P_4$, leading to a subsequent time delay $\Delta T_B$ between the corresponding subsequent first and second signals $S\mathbf{1}_B$, $S\mathbf{2}_B$.

While the plot 80 illustrates a particular time-ordered sequence of the signals $S\mathbf{1}_A$, $S\mathbf{2}_A$, $S\mathbf{1}_B$, $S\mathbf{2}_B$, it should be understood that the particular sequential order of signals $S\mathbf{1}_A$, $S\mathbf{2}_A$, $S\mathbf{1}_B$, $S\mathbf{2}_B$ received by the controller 55 can vary depending on a relative positioning of the first and second sensors 51, 52, the optical conductor 60, and the supply wire(s) 38. For instance, in certain implementations the subsequent first signal $S\mathbf{1}_B$ (corresponding to the second pulse location $\mathbf{64}_B$) may be received by the controller 55 before or after the second signal $S\mathbf{2}_A$ (corresponding to the first pulse location $\mathbf{64}_A$). In the non-limiting example shown, a first recurrent time interval $\Delta T\mathbf{1}$ is illustrated between the first signal $S\mathbf{1}_A$ and the subsequent first signal $S\mathbf{1}_B$. Put another way, the first recurrent time interval $\Delta T\mathbf{1}$ represents a time between successive signals received by the controller module 55 from the first sensor 51. In addition, a second recurrent time interval $\Delta T\mathbf{2}$ is illustrated between the second signal $S\mathbf{2}_A$ and the subsequent second signal $S\mathbf{2}_B$. As shown, the first recurrent time interval $\Delta T\mathbf{1}$ is longer than the second recurrent time interval $\Delta T\mathbf{2}$ though this need not be the case. It should be understood that the first and second recurrent time intervals $\Delta T\mathbf{1}$, $\Delta T\mathbf{2}$ can have relative durations that are dependent on the relative positioning of the first and second sensors 51, 52, the optical conductor 60, and the supply wire(s) 38.

Further still, the second signal $S\mathbf{2}_A$ can also have a modified signal characteristic compared to the first signal $S\mathbf{1}_A$. Such a signal characteristic can include, but is not limited to, an amplitude or peak value, a full-width-half-maximum (FWHM) value, a waveform, a phase, or the like. In the non-limiting example shown, the first signal $S\mathbf{1}_A$ has a higher amplitude compared to the second signal $S\mathbf{2}_A$, leading to the first voltage $V\mathbf{1}_A$ being larger than the second voltage $V\mathbf{2}_A$. In addition, in the non-limiting example shown, the subsequent second signal $S\mathbf{2}_B$ can have a modified signal characteristic compared to the subsequent first signal $S\mathbf{1}_B$, such as the subsequent second signal $S\mathbf{2}_B$ having a higher amplitude compared to the subsequent first signal S1B.

It is contemplated that amplitude differences between signals, such as between the first signal $S\mathbf{1}_A$ and the second signal $S\mathbf{2}_A$, can be at least partially formed by differences in travel distances through the optical conductor 60, such as between the first and second portions $P_1$, $P_2$ (FIG. 3). For instance, scattering or other cumulative-effect losses may occur during wave propagation within the optical conductor 60, such that the second signal $S\mathbf{2}_A$ is more strongly affected by amplitude reduction than the first signal $S\mathbf{1}_A$.

It is also contemplated that amplitude differences between signals, such as between the subsequent first signal $S\mathbf{1}_B$ and the subsequent second signal $S\mathbf{2}_B$, can also be at least partially formed by the filter 68 modifying a wave characteristic or either or both of the portions $P_3$, $P_4$ prior to detection by the respective sensors 51, 52 (FIG. 4). Such a wave characteristic can include, but is not limited to, a frequency composition, a frequency band, an amplitude, a phase, or the like. For instance, the third portion $P_3$ shown in FIG. 4 encounters the filter 68 prior to detection by the first sensor 51, while the fourth portion $P_4$ does not encounter the filter 68. In this manner, the filter 68 can reduce the amplitude of the third portion $P_3$, leading to a peak voltage reduction in the subsequent first signal $S\mathbf{1}_B$ compared to the subsequent second signal $S\mathbf{2}_B$.

Furthermore, it is contemplated that the filter 68 can modify multiple wave characteristics of any of the portions $P_1$, $P_2$, $P_3$, $P_4$. For instance, the filter 68 can modify both an amplitude and a frequency composition (e.g. removing predetermined frequencies) of the second and third portions $P_2$, $P_3$. Such a change in frequency composition can lead to the second signal $S\mathbf{2}_A$ having a wider FWHM compared to the first signal $S\mathbf{1}_A$, though this need not be the case. In other examples, the filter 68 can narrow the FWHM, or form a new waveform/geometric profile, or the like.

Referring generally to FIGS. 1-5, during operation, the controller 55 can be configured to receive sensor signals from the first and second sensors 51, 52, including any or all of the sensor signals $S1_A$, $S2_A$, $S1_B$, $S2_B$ and perform a comparison of the received sensor signals. Such a comparison can include comparing sensor signals received due to a single incident EM pulse, or multiple or recurring incident EM pulses, or the like. Such a comparison can also include determining a time delay between received sensor signals, such as the time delay $\Delta T_A$, the subsequent time delay $\Delta T_B$, the first recurrent time interval ΔT1, or the second recurrent time interval ΔT2. The time delay can include, but is not limited to: a delay between detection of the first and second portions $P_1$, $P_2$; a delay between detection of the third and fourth portions $P_3$, $P_4$; a delay between detection of the first and third portions $P_1$, $P_3$ by the first sensor 51; or a delay between detection of the second and fourth portions $P_2$, $P_4$ by the second sensor 52.

Such a comparison of the received sensor signals can additionally include comparing a signal characteristic of the first and second sensor signals S1, S2, including an amplitude, a waveform, a FWHM, a phase, or the like, as described above. For instance, the controller 55 can receive a sensor signal from the first sensor 51 corresponding to the first portion $P_1$, and evaluate the received sensor signal to determine whether the first portion $P_1$ encountered the filter 68 prior to detection at the first sensor 51. Such evaluation can include, but is not limited to, comparing the sensor signal against a baseline or calibration waveform, performing a frequency analysis or comparison, performing an amplitude analysis or comparison, performing a wave phase analysis or comparison, or the like, or combinations thereof. In this manner, the controller 55 can be configured to determine whether a particular sensor signal indicates wave modification by the filter 68.

Such a comparison of the received sensor signals can further include verification or validation of a determined value or analysis. For instance, in one non-limiting example of operation, the controller 55 can compare the time delay $\Delta T_A$ and the subsequent time delay $\Delta T_B$. The controller 55 can then perform a verification or validation of the time delay $\Delta T_A$ based on the subsequent time delay $\Delta T_B$. Additionally or alternatively, the controller 55 can verify or validate either or both of the time delay $\Delta T_A$ or the subsequent time delay $\Delta T_B$ based on the first or second recurrent time intervals ΔT1, ΔT2.

It should also be understood that the controller 55 can repeatedly perform comparisons during operation, where such comparisons can include determining values, evaluating, verifying, validating, or the like as described above. In non-limiting examples, the controller 55 can repeatedly perform such comparisons at regular time intervals, at irregular time intervals, in real-time during operation, based on a triggering signal, based on a signal threshold, based on a value threshold, or the like, or combinations thereof.

Upon performing the comparison of received sensor signals, the controller 55 can be configured to determine a fault location in the component, e.g. the fault location 75 in the supply wire 38 (FIG. 3). Such a determined fault location can include, but is not limited to, a single position value, a range of position values, an uncertainty corresponding to a position value or range, an identification of the supply wire 38 having the electrical fault, an uncertainty corresponding to the above-described identification, or the like. Such a position or range of positions can include a location along the wire length 38L (FIG. 2) in some implementations. For instance, in a non-limiting example, the fault location 75 can indicate a 1-meter segment of the supply wire 38. Additionally or alternatively, the position or range of positions can include an axial location along the axial direction A. It should be understood that the fault location 75 and the pulse location (e.g. the pulse locations $64_A$, $64_B$) can share a common axial location along the axial direction A in some implementations.

The controller 55 can determine the fault location based at least on the time delay between received signals from the first or second sensors 51, 52. For instance, the controller 55 can determine the fault location 75 based on one or more system characteristics including, but not limited to, the first or second spacing distances D1, D2, the time delay $\Delta T_A$, the subsequent time delay $\Delta T_B$, the first or second recurrent time intervals ΔT1, ΔT2, or a comparison of successive values for any or all of the time delay $\Delta T_A$, the subsequent time delay $\Delta T_B$, or the first or second recurrent time intervals ΔT1, ΔT2. For example, the first spacing distance D1 can be correlated with the time delay $\Delta T_A$ between the first and second signals S1, S2 (FIG. 5), which can further correlate to the fault location in the electrical component. The controller 55 can additionally verify or validate the determined fault location based on the one or more system characteristics described above. Such verification or validation can include system characteristics from a single sensed value, multiple sensed values, a single received signal, or multiple received signals. Such sensed values or received signals can be sensed or received from a single source, from multiple sources, at a single time, or over a time interval.

In one non-limiting example, the controller 55 can retrieve one or more spacing distances (e.g. the first or second spacing distances D1, D2) from memory. The controller 55 can also perform a signal comparison to determine at least the time delay $\Delta T_A$. The controller 55 can determine the fault location 75 based on the retrieved one or more spacing distances and the time delay $\Delta T_A$.

Furthermore, the controller 55 can be additionally configured to determine a pulse location along the optical conductor 60 (e.g., the first pulse location $64_A$ or the second pulse location $64_B$). The determined pulse location can include, but is not limited to, a single position value, a range of position values, an uncertainty corresponding to a position value or range, or the like. Such a position or range of positions can include a location along the conductor length 60L (FIG. 2) in some implementations. Additionally, or alternatively, the position or range of positions can include an axial location along the axial direction A in some implementations.

The controller 55 can determine the pulse location based on one or more system characteristics including, but not limited to, the first or second spacing distances D1, D2, the time delay $\Delta T_A$, the subsequent time delay $\Delta T_B$, the first or second recurrent time intervals ΔT1, ΔT2, or a comparison of successive values for any or all of the time delay $\Delta T_A$, the subsequent time delay $\Delta T_B$, or the first or second recurrent time intervals ΔT1, ΔT2. For instance, in one non-limiting example of operation, the controller 55 can be configured to determine the pulse location along the optical conductor 60 based on the time delay $\Delta T_A$ alone. In another non-limiting example, the controller 55 can be configured to determine the pulse location based on a combination of the time delay $\Delta T_A$, a determination of "wave modification present" by the filter 68 of the second portion $P_2$, and a determination of "no wave modification" of the first portion $P_1$.

In some implementations, the controller 55 can be further configured to determine whether two received signals correspond to a common incident EM pulse or separate incident EM pulses. For instance, based at least on the time delay $\Delta T_A$, the controller 55 can determine that the first and second portions $P_1$, $P_2$ originate from a common incident EM pulse at the first pulse location $64_A$. In another non-limiting example, based at least on the subsequent time delay $\Delta T_B$, the controller 55 can determine that the third and fourth portions $P_3$, $P_4$ originate from a common incident EM pulse at the second pulse location $64_B$. In another non-limiting example, the controller 55 can compare the time delay $\Delta T_A$ to the subsequent time delay $\Delta T_A$ and determine that the first pulse location $64_A$ is spaced from the second pulse location $64_B$. In still another non-limiting example, based at least on the first recurrent time interval ΔT1 or the second recurrent time interval ΔT2, the controller 55 can determine that the portions $P_1$, $P_3$ originate from separate incident-pulse locations on the optical conductor 60 (e.g. the first and second pulse locations $64_A$, $64_B$).

Still further, the controller 55 can be configured to provide an output indicating the fault location (e.g., the fault location 75). Such an output can include at least one of a visual output, an audio output, a display output, a tactile output, a text log entry, or a maintenance request, in non-limiting examples. The output can be transmitted to another component or system, such as the power controller 40, another controller module, a light source, a display, a memory, an actuator providing tactile feedback, an audio source, or the like. In one non-limiting example of operation, the power controller 40 can receive the output indicative of the fault location 75 and controllably operate the node output 36 based on the output, such as modifying or stopping a supply of power from the node output 36. In another non-limiting example of operation, the controller 55 can transmit the output to another aircraft system, such as a text log which may be stored in a memory, or a request for maintenance, or a cockpit alert e.g., a flashing light, a text display, an audio alert, a vibrational or haptic alert, or the like.

In this manner, the controller 55 can receive sensor signals indicative of an arc fault F in a component of the power distribution system 30, including in one or more supply wires 38. The controller 55 can perform a comparison of the received sensor signals, such as the first and second signals $S1_A$, $S2_A$. Such a comparison can include determining a time delay between the received sensor signals, such as the time delay $\Delta T_A$. The controller 55 can additionally be configured to provide an indication of the fault location 75, including at least one of an audio alert or a display output in non-limiting examples. Furthermore, based on the determined time delay, the controller 55 can determine at least a location of the arc fault F in the component, such as the fault location 75 in the supply wire 38. The controller 55 can additionally determine a pulse location (e.g. the first or second pulse locations $64_A$, $64_B$) along the optical conductor 60 where the arc flash was incident thereon, based on the time delay as described above. Such a pulse location can be utilized by the controller 55 to determine or verify a determined fault location.

Figure 6:
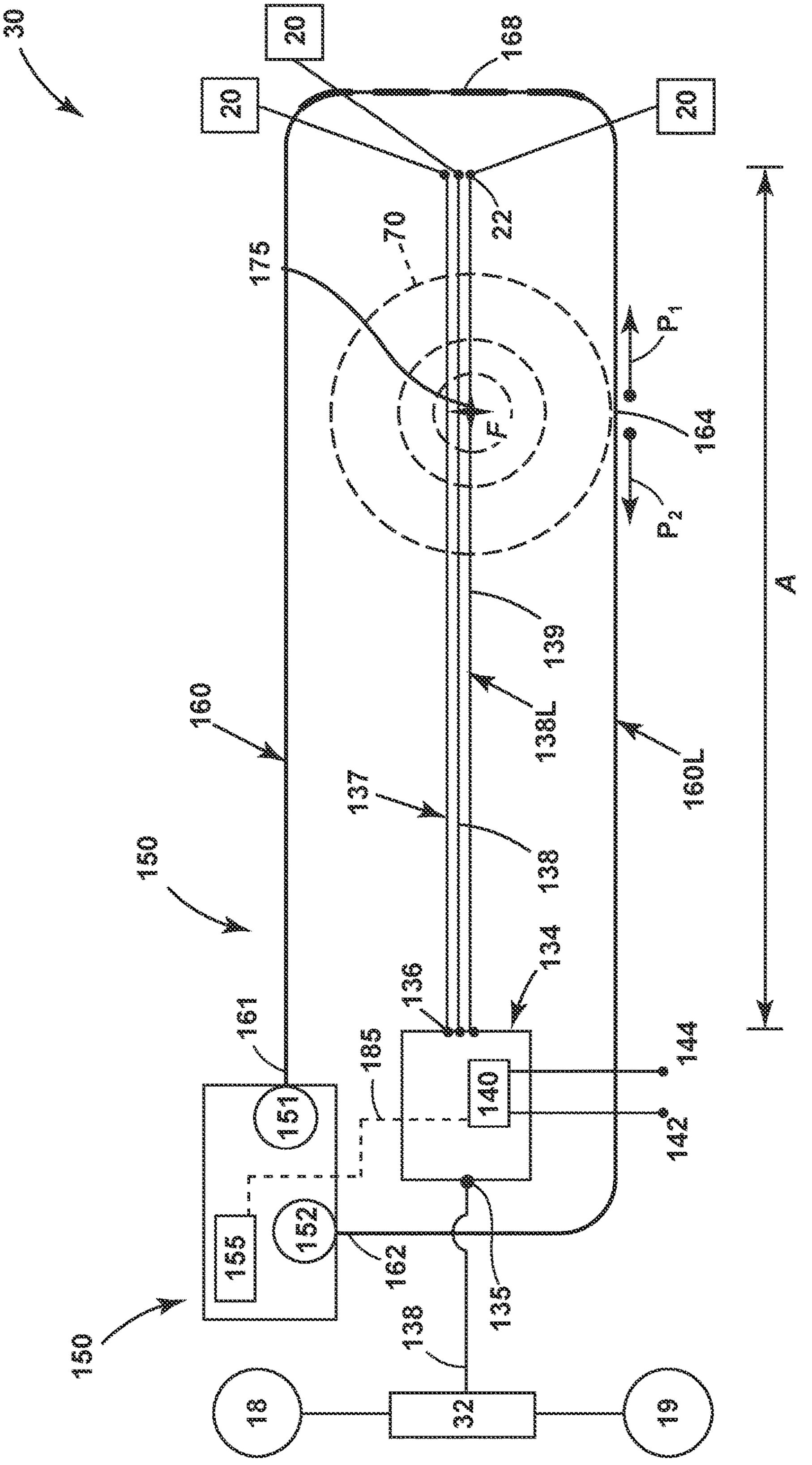
FIG. 6 is a schematic view of another fault detection system that can be utilized in the power distribution system of FIG. 1 in accordance with various aspects described herein.

Referring now to FIG. 6, another fault detection system 150 is illustrated that can be utilized in the aircraft 10 (FIG. 1). The fault detection system 150 is similar to the fault detection system 50 of FIG. 2. Therefore, like parts are described with like numerals increased by 100, with it being understood that the description of the like parts of the fault detection system 50 applies to the fault detection system 150, except where noted.

In addition, another power distribution node 134 in the PDS 30 is shown that can supply power to the electrical loads 20. The PDN 134 is similar to the PDN 34 of FIG. 2. Therefore, like parts are described with like numerals increased by 100, with it being understood that the description of the like parts of the PDN 34 applies to the PDN 134, except where noted.

In the non-limiting example shown, the PDN 134 includes one node input 135 and three node outputs 136. Any number of node inputs 135 or node outputs 136 can be provided. A power controller 140 is also provided with the PDN 134. The power controller 140 can include at least one data input 142 and at least one data output 144. While not shown in FIG. 6, it is contemplated that an additional component, e.g. the second controller 45, can be communicatively or controllably coupled to the data input 142 or the data output 144.

A bundle 137 with multiple supply wires 138, similar to the supply wires 38 (FIG. 2), provides at least an electrical connection between the PDN 134 and the electrical loads 20. Additional supply wires 138 can also electrically couple the PDN 134 to the power bus 32. As described above, the power bus 32 can be electrically coupled to either or both of the power source 18 or the second power source 19. In addition, in the illustrated example, each supply wire 138 in the bundle 137 defines a wire length 138L between a corresponding node output 136 and coupling 22. For instance, the bundle 137 can be formed by securing the multiple supply wires 138 together with fasteners, sleeves, or the like. As described above, the bundle 137 can also include a cable with a common connector at each end and coupled to the multiple supply wires 138, or a cable snake, or the like.

The fault detection system 150 includes a first sensor 151, a second sensor 152, a controller module 155 (also referred to herein as "controller 155"), and an optical conductor 160 extending between a first end 161 and a second end 162. One difference compared to the fault detection system 50 is that the controller module 155 is a separate, discrete component that is communicatively coupled to the power controller 140. A communication link 185 can be provided between the controller 155 and the power controller 140. For visual clarity, the communication link 185 is illustrated schematically in dashed line extending between the controller 155 and the power controller 140. It should be understood that the communication link 185 can provide a wired or wireless signal connection, including one-way communication or two-way communication, between the controller 155 and the power controller 140. In some implementations, the communication link 185 can be coupled to the data input 142 or the data output 144. Additionally or alternatively, a separate or dedicated input/output port can be provided with the power controller 140 or the controller 155 for handling signals transmitted along the communication link 185. Further still, it is contemplated that the controller 155 can be communicatively or operably coupled to an additional component, e.g. the second controller 45 (FIG. 4), by way of the data input 142 or the data output 144.

The optical conductor 160 is arranged to form a loop about the bundle 137 as shown. The optical conductor 160 defines a conductor length 160L and extends at least partially along an axial direction A. One difference compared to the fault detection system 50 is that the axial direction A is defined between the node output 136 and the coupling 22.

An optical filter 168 can also be provided. Another difference compared to the fault detection system 50 is that the optical filter 168 is incorporated into or integrated with the optical conductor 160. For instance, the optical filter 168 can be in the form of a fiber Bragg grating extending through at least a portion of the optical conductor 160. In the non-limiting example shown, multiple fiber Bragg gratings are shown along the optical conductor 160 though this need not be the case. The optical filter 168 can include a single fiber Bragg grating or multiple fiber Bragg gratings. The optical filter 168 can also extend along or through a single portion, multiple discrete portions, or the entire length of the optical conductor 160.

During operation, an arc fault F (illustrated with a star) may occur within the bundle 137. Such an arc fault F generates an EM pulse 70 as described above, which is shown propagating outward with concentric dashed circles. When the EM pulse 70 is incident on the optical conductor 160 at the pulse location 164, a first portion $P_1$ of the EM pulse 70 propagates toward the first end 161 and a second portion $P_2$ propagates toward the second end 162. The first sensor 151 and the second sensor 152 can sense or detect the respective first portion $P_1$ and second portion $P_2$ of the EM pulse 70. The first and second sensors 151, 152 can transmit corresponding sensor signals to the controller 155 indicative of the EM pulse 70 propagating through the optical conductor 160 as described above.

The controller 155 can compare the received sensor signals and determine a fault location 175 along the bundle 137 as described above. The fault location 175 can include, but is not limited to, a single position value, a range of position values, an uncertainty corresponding to a position value or range, an identification of the supply wire having the electrical fault, an uncertainty corresponding to the above-described identification, or the like. Such a position or range of positions can include a location along the wire length 138L, or an axial location along the axial direction A, as described above. In the illustrated example, the fault location 175 includes a position along the wire length 138L as well as an identification 139 of the supply wire 138 having the electrical fault. The controller 155 can also verify or validate the determined fault location based on one or more system characteristics as described above. Furthermore, the controller 155 can be configured to provide an output indicating the fault location, including at least one of a visual output, an audio output, a display output, a tactile output, a text log entry, or a maintenance request. The power controller 140 can also receive the output indicative of the fault location 175 and controllably operate the node output 136 based on the output, as described above. Additionally or alternatively, the controller 155 can transmit the output to another aircraft system as described above.

The controller 155 can additionally determine the pulse location 164 along the optical conductor 160 as described above. The determined pulse location can include, but is not limited to, a single position value, a range of position values, an uncertainty corresponding to a position value or range, or the like. Such a position or range of positions can include a location along the conductor length 160L, or an axial location along the axial direction A, as described above. It should be understood that the fault location 175 and the pulse location 164 can share a common axial location along the axial direction A in some implementations.

Figure 7:
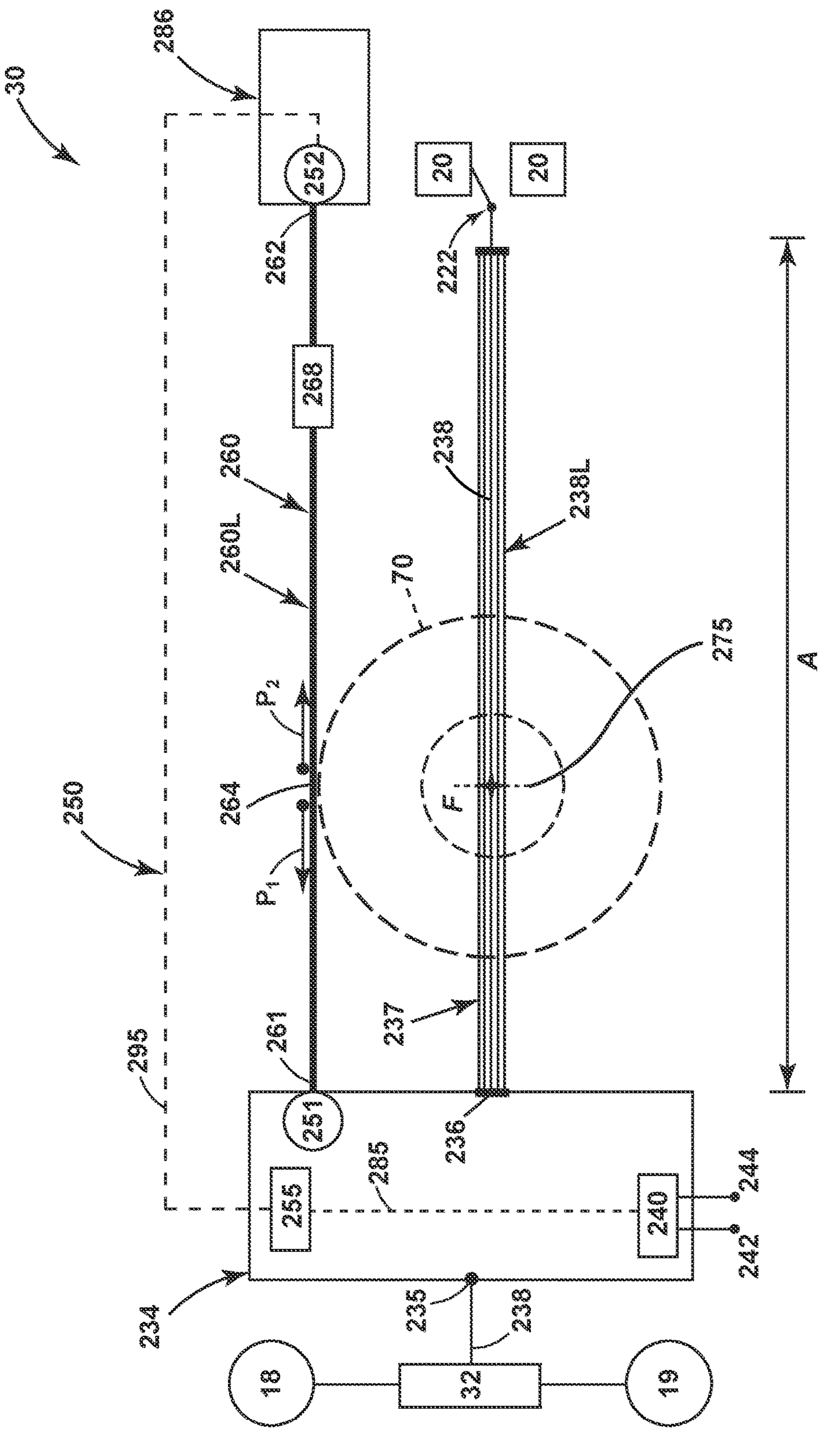
FIG. 7 is a schematic view of another fault detection system that can be utilized in the power distribution system of FIG. 1 in accordance with various aspects described herein.

Turning to FIG. 7, another fault detection system 250 is illustrated that can be utilized in the aircraft 10 (FIG. 1). The fault detection system 250 is similar to the fault detection systems 50, 150. Therefore, like parts are described with like numerals further increased by 100, with it being understood that the description of the like parts of the fault detection systems 50, 150 applies to the fault detection system 250, except where noted.

In addition, another power distribution node 234 in the PDS 30 is shown that can supply power to the electrical loads 20. The PDN 234 is similar to the PDNs 34, 134. Therefore, like parts are described with like numerals further increased by 100, with it being understood that the description of the like parts of the PDNs 34, 134 applies to the PDN 234, except where noted.

In the non-limiting example shown, the PDN 234 includes one node input 235 and one node output 236. Any number of node inputs 235 or node outputs 236 can be provided. A power controller 240 is also provided with the PDN 234. The power controller 240 can include at least one data input 242 and at least one data output 244. While not shown in FIG. 7, it is contemplated that an additional component, e.g. the second controller 45, can be communicatively or controllably coupled to the power controller 240, the data input 242, or the data output 244.

A cable 237 with multiple internal supply wires 238, similar to the supply wires 38, 138, provides at least an electrical connection between the PDN 234 and electrical loads 20. Additional supply wires 238 can also electrically couple the PDN 234 to the power bus 32. As described above, the power bus 32 can be electrically coupled to either or both of the power source 18 or the second power source 19.

In addition, in the illustrated example, each supply wire 238 in the cable 237 extends between the node output 236 at one end and a single coupling 222 at the other end. One difference compared to the PDNs 34, 234 is that the coupling 222 can be in the form of a switchable coupling between the cable 237 and multiple electrical loads 20, though this need not be the case. It should be understood that the cable 237 can have any suitable form, including multiple connectors at either end for corresponding multiple couplings 22, 222.

The fault detection system 250 includes a first sensor 251, a second sensor 252, a controller module 255 (also referred to herein as "controller 255"), and an optical conductor 260 extending between a first end 261 and a second end 262. One difference compared to the fault detection systems 50, 150 is that the controller 255 is provided within the PDN 234 and separated from the power controller 240. A communication link 285, internal to the PDN 234, can be provided between the controller 255 and the power controller 240 as shown. The communication link 285 can provide a wired or wireless signal connection, including one-way communication or two-way communication, between the controller 255 and the power controller 240. It is further contemplated that the communication link 285 can provide signal communication between the controller 255 and the second controller 45 (FIG. 2), as described above.

Another difference compared to the fault detection systems 50, 150 is that the first sensor 251 and the second sensor 252 are provided within separate components. In the illustrated example, the first sensor 251 is provided with the PDN 234, and the second sensor 252 is provided in a separate component 286 in the PDS 30. The component 286 can include a sensor housing, another electrical load, another controller module, or another power distribution node, in non-limiting examples. A sensor communication link 295, similar to the communication link 185, 285 is provided between the controller 155 and the second sensor 252.

The optical conductor 260 defines a conductor length 260L and extends at least partially along an axial direction A. Another difference compared to the fault detection systems 50, 150 is that the optical conductor 260 extends alongside the cable 237 without forming a physical loop. In addition, an optical filter 268 can be provided. The optical filter 268 can be a discrete or separate component operably coupled to the optical conductor 260, or can be incorporated into or integrated with the optical conductor 260 as described above. For instance, the optical filter 268 can include one or more fiber Bragg gratings, a thin-film interference filter, a bandpass filter, a coating over a portion of the optical conductor 260, or the like.

During operation, an arc fault F (illustrated with a star) may occur within the cable 237. Such an arc fault F generates an EM pulse 70 as described above, which is shown propagating outward with concentric dashed circles. When the EM pulse 70 is incident on the optical conductor 260 at the pulse location 264, a first portion $P_1$ of the EM pulse 70 propagates toward the first end 261 and a second portion $P_2$ propagates toward the second end 262. The first sensor 251 and the second sensor 252 can sense or detect the respective first portion $P_1$ and second portion $P_2$ of the EM pulse 70. The first and second sensors 251, 252 can transmit corresponding sensor signals to the controller 255 indicative of the EM pulse 70 propagating through the optical conductor 260 as described above.

The controller 255 can compare the received sensor signals and determine a fault location 275 along the cable 237 as described above. The fault location 275 can include, but is not limited to, a single position value, a range of position values, an uncertainty corresponding to a position value or range, an identification of the supply wire having the electrical fault, an uncertainty corresponding to the above-described identification, or the like. Such a position or range of positions can include a location along the wire length 238L, or an axial location along the axial direction A, as described above. In the illustrated example, the fault location 275 includes an axial position along the wire length 138L (indicated with a dashed line). The controller 255 can also verify or validate the determined fault location based on one or more system characteristics as described above. Furthermore, the controller 255 can be configured to provide an output indicating the fault location, including at least one of a visual output, an audio output, a display output, a tactile output, a text log entry, or a maintenance request. The power controller 240 can also receive the output indicative of the fault location 275 and controllably operate the node output 236 based on the output, as described above. Additionally or alternatively, the controller 255 can transmit the output to another aircraft system as described above.

The controller 255 can additionally determine the pulse location 264 along the optical conductor 260 as described above. The determined pulse location can include, but is not limited to, a single position value, a range of position values, an uncertainty corresponding to a position value or range, or the like. Such a position or range of positions can include a location along the conductor length 260L, or an axial location along the axial direction A, as described above. It should be understood that the fault location 275 and the pulse location 264 can share a common axial location along the axial direction A in some implementations.

Figure 8:
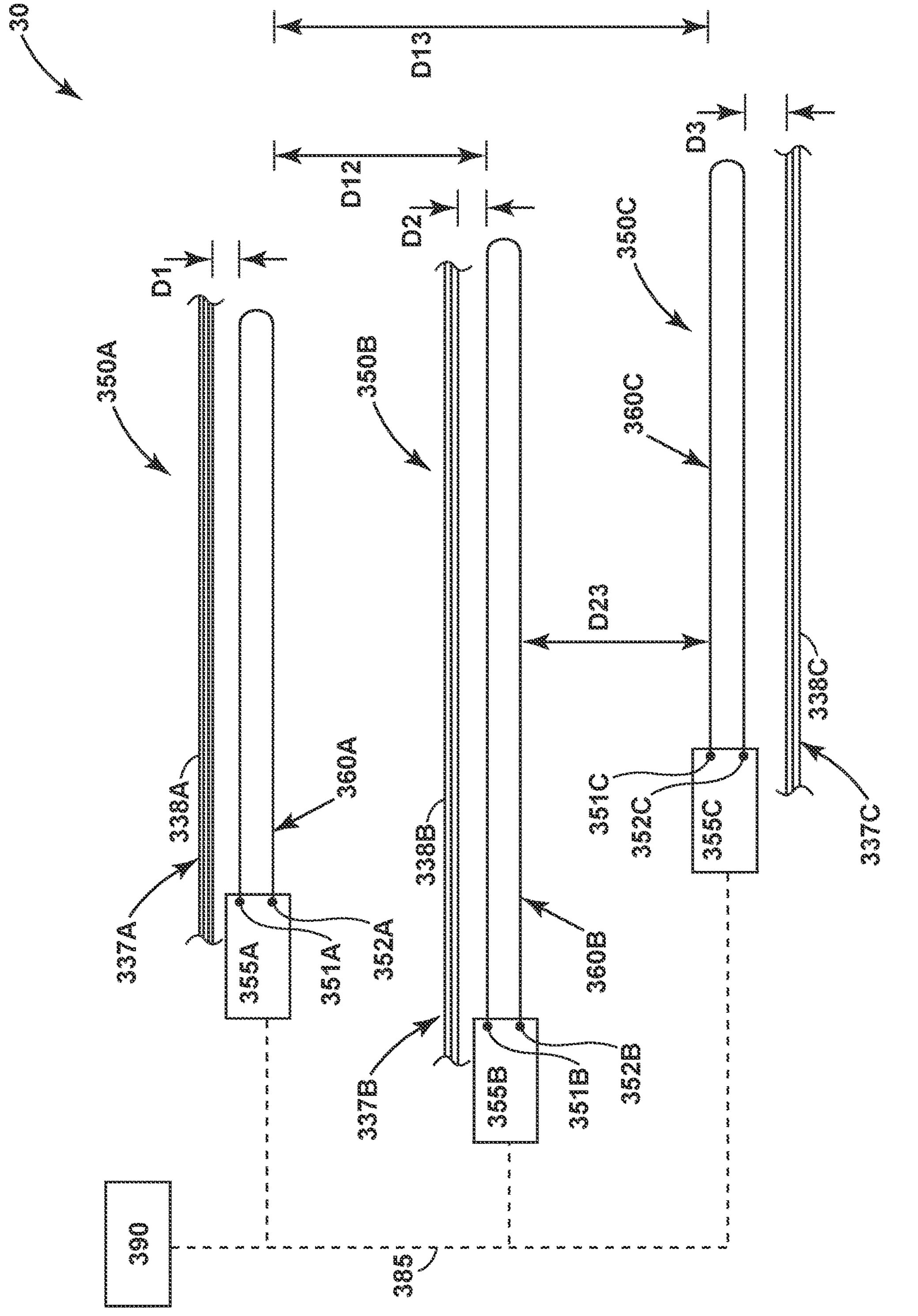
FIG. 8 is a schematic view of another fault detection system that can be utilized in the power distribution system of FIG. 1 in accordance with various aspects described herein.

Referring now to FIG. 8, another fault detection system 350 is illustrated that can be utilized in the aircraft 10, including the power distribution system 30 (FIG. 1). The fault detection system 350 is similar to the fault detection systems 50, 150, 250. Therefore, like parts are described with like numerals further increased by 100, with it being understood that the description of the like parts of the fault detection systems 50, 150, 250 applies to the fault detection system 350, except where noted.

One difference compared to the fault detection systems 50, 150, 250 is that the fault detection system 350 can have a modular arrangement or form. In the exemplary implementation shown, the fault detection system 350 includes a first fault detection module 350A, a second fault detection module 350B, and a third fault detection module 350C. Any number of fault detection modules can be provided.

Each fault detection module 350A, 350B, 350C includes a corresponding first sensor 351A, 351B, 351C, a corresponding second sensor 352A, 352B, 352C, a corresponding controller module (or "controller") 355A, 355B, 355C, and a corresponding optical conductor 360A, 360B, 360C. In some implementations, one or more of the controllers 355A, 355B, 355C can include a power controller for selectively supplying power to at least one electrical load, including the controllers 55, 155, 255 described above, or for controllably operating a node output, such as the node output 36, 136, 236 described above. In some implementations, one or more of the controllers 355A, 355B, 355C can be communicatively coupled to a separate power controller, including the controllers 55, 155, 255 described above.

It is also contemplated that any of the fault detection modules 350A, 350C, 350C can include, or have the form or arrangement, of any of the fault detection systems 50, 150, 250 described above. For instance, while the optical conductors 360A, 360B, 360C are illustrated as forming loops, it should be understood that any of the optical conductors 360A, 360C, 360C can have other geometric arrangements, such as the linear or axial arrangement shown in FIG. 7. Furthermore, the optical conductors 360A, 360B, 360C can include one or more optical filters, including the optical filter 68, 168, 268 described above.

A system controller module 390 (or "system controller 390") can also be provided in signal communication with any or all of the first controller 355A, second controller 355B, or third controller 355C. In some implementations, the system controller 390 can include a power controller for selectively supplying power to at least one electrical load, including the controllers 55, 155, 255 described above, or for controllably operating a node output, such as the node output 36, 136, 236 described above. In some implementations, the system controller 390 can be in signal communication with a separate power controller, such as the power controller 40, 140, 240, or the second controller 45 as described above. In the example shown, a communication link 385 is provided for signal communication, operative coupling, or the like between at least the system controller 390 and the controllers 355A, 355B, 355C. For instance, the communication link 385 can provide a wired or wireless signal connection, including one-way communication or two-way communication, between the system controller 390 and the controllers 355A, 355B, 355C.

The fault detection system 350 can be configured to sense, detect, or indicate an electrical fault and corresponding fault location in multiple electrical components. In the illustrated example, the fault detection modules 350A, 350B, 350C are arranged alongside corresponding exemplary cables 337A, 337B, 337C as shown. The cables 337A, 337B, 337C are similar to the bundles 137, 237 and can each carry multiple supply wires 338A, 338B, 338C. The cables 337A, 337B, 337C are shown in isolation for visual clarity, and it should be understood that the cables 337A, 337B, 337C can receive power from the first or second power sources 18, 19, the power bus 32, or the like, and also supply power to one or more electrical loads 20 as described above (FIG. 7).

The fault detection system 350 defines various physical parameters based at least on relative arrangement of the first, second, and third fault detection modules 350A, 350B, 350C. In the example shown, a first spacing distance D1 is defined between the first optical conductor 360A and the first cable 337A, a second spacing distance D2 is defined between the second optical conductor 360B and the second cable 337B, and a third spacing distance D3 is defined between the third optical conductor 360C and the third cable 337C. The spacing distances D1, D2, D3 are illustrated as minimum spacing distances, though this need not be the case. In some implementations, the first, second, or third spacing distances D1, D2, D3 can be defined as an average spacing distance, a local minimum spacing distance, or the like between the respective optical conductors 360A, 360B, 360C and cables 337A, 337B, 337C.

In addition, a first pair spacing D12 is illustrated between the first and second fault detection modules 350A, 350B, a second pair spacing D23 is illustrated between the second and third fault detection modules 350B, 350C, and a third pair spacing D13 is illustrated between the first and third fault detection modules 350A, 350C. As shown, the first pair spacing D12 is defined as a minimum distance between the corresponding optical conductors 360A, 360B, the second pair spacing D23 is defined as a minimum distance between the corresponding optical conductors 360B, 360C, and the third pair spacing D13 is defined as a minimum distance between the corresponding optical conductors 360A, 360C. It is contemplated that the pair spacings D12, D23, D13 can also be defined as an average spacing distance, a local minimum spacing distance, or the like.

Figure 9:
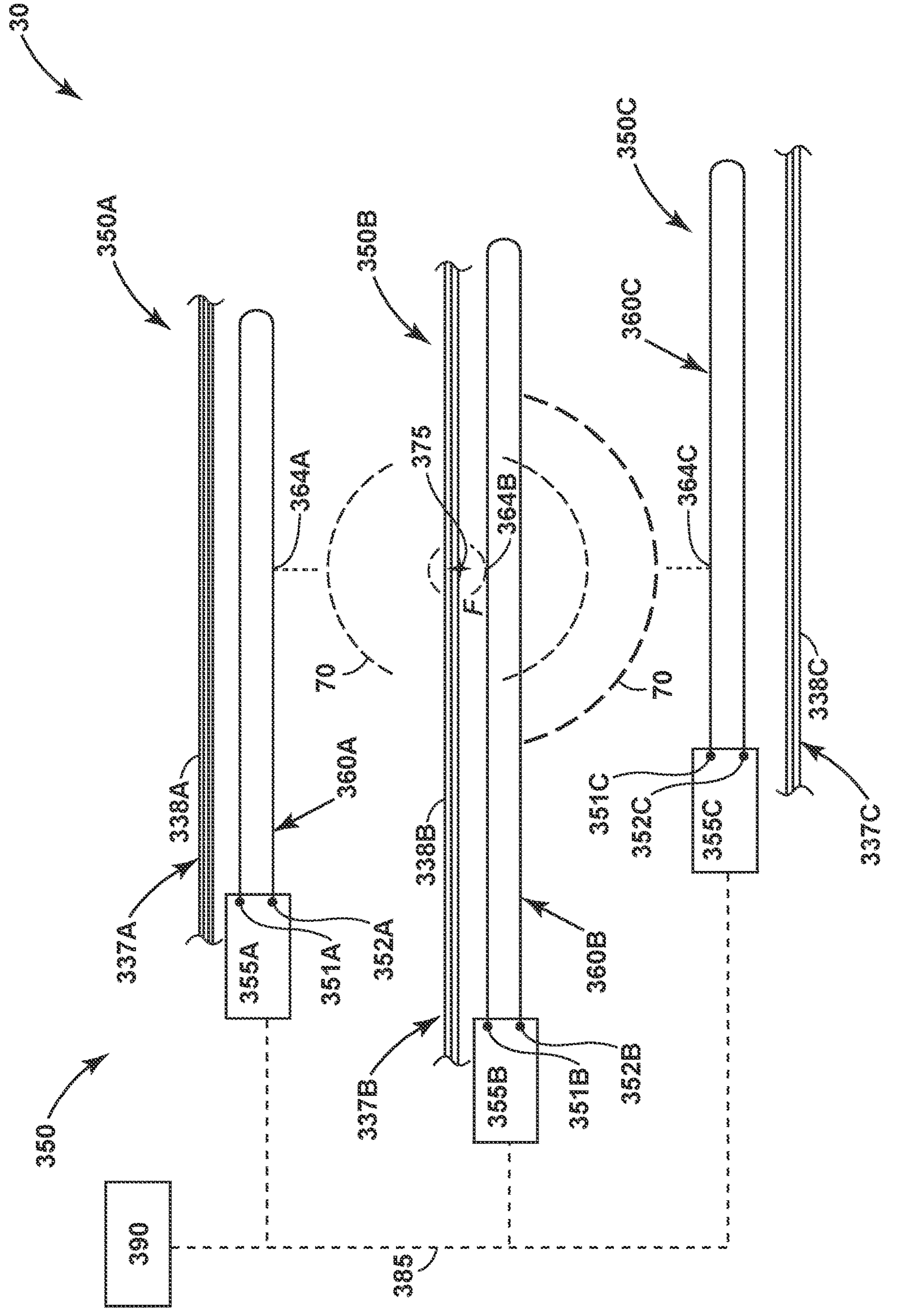
FIG. 9 is a schematic view of the fault detection system of FIG. 8 and illustrating an electrical fault generating an electromagnetic wave.

FIG. 9 illustrates the fault detection system 350 and the power distribution system 30 during one example of operation where an arc fault F (illustrated with a star) is present in the second cable 337B. The arc fault F generates an EM pulse 70, such as an arc flash, having a range of emitted EM frequencies including optical or ultraviolet as described above.

The EM pulse 70 is illustrated with concentric dashed circles each indicating an advancing wave front over time. In the non-limiting example shown, the arc fault F has a fault location 375 near one edge of the second cable 337B such that the EM pulse 70 is partially attenuated in a direction toward the first cable 337A. It is also contemplated that the EM pulse 70 can propagate from the second cable 337B without attenuation in all directions, or be fully attenuated with no propagation toward the first cable 337A, in some non-limiting examples.

As shown, the EM pulse 70 is incident on each of the first optical conductor 360A, second optical conductor 360B, and third optical conductor 360C at a respective first pulse location 364A, second pulse location 364B, and third pulse location 364C. As described above, portions of the EM pulse 70 propagate through each optical conductor 360A, 360B, 360C and are detected by the corresponding sensors 351A, 352A, 351B, 352B, 351C, 352C. Sensor signals can be received by the corresponding controllers 355A, 355B, 355C that are indicative of the EM pulse 70 propagating through the optical conductor 360A, 360B, 360C as described above.

In addition, the controllers 355A, 355B, 355C can transmit or receive signals from the system controller 390 by way of the communication link 385. For instance, the system controller 390 can receive any or all of: a set of first signals from the first controller 355A, a set of second signals from second controller 355B, or a set of third signals from the third controller 355C. In the non-limiting example shown, the system controller 390 can receive the set of second signals, followed by the set of first signals, followed by the set of third signals, wherein each of the sets of first, second, and third signals correspond to the electrical fault F. The system controller 390 can compare such signals, including based on known arrangements, spacing distances, or the like, such as the spacing distances D1, D2, D3, D12, D23, or D13 (FIG. 8). In this manner, the system controller 390 can be configured to determine a relationship condition between sets of signals received by the controllers 355A, 355B, 355C. For instance, the system controller 390 can determine a dependence condition wherein the sets of first, second, and third signals are determined to correspond to a common electrical fault. In an alternate non-limiting example, the system controller 390 can determine an independence condition wherein the set of first signals and the set of second signals are determined to correspond to separate electrical faults. In yet another non-limiting example, the system controller 390 can directly receive sensor signals from any or all of the first sensor 351A, 351B, 351C or the second sensor 352A, 352B, 352C. In still another non-limiting example, the system controller 390 can be configured to controllably operate a node output of the PDS 30 based on a determined dependence condition, or based on a determined independence condition.

With general reference to FIGS. 1-9, during operation, the controller 55, 155, 255, 355A, 355B, 355C can receive signals from the first sensor 51, 151, 251, 351A, 351B, 351C and the second sensor 52, 152, 252, 352A, 352B, 352C. As described above, the controller 55, 155, 255, 355A, 355B, 355C can be configured to determine the location of an electrical fault F in an electrical component, including the fault location 75, 175, 275, 375.

It is further contemplated that the controller 55, 155, 255, 355A, 355B, 355C can be controllably or communicatively coupled to any or all of the node inputs 35, 135, 235, the node outputs 36, 136, 236, the data inputs 42, 142, 242, or the data outputs 44, 144, 244. For instance, in one non-limiting example, the controller 55, 155, 255, 355A, 355B, 355C, 390 can be configured to monitor an operational status of the node output 36, 136, 236. Such monitoring data can be utilized by the controller 55, 155, 255, 355A, 355B, 355C, 390 in combination with signals from the first sensor 51, 151, 251, 351A, 351B, 351C and the second sensor 52, 152, 252, 352A, 352B, 352C for signal confirmation, signal validation, signal merging, status reporting, or the like. Additionally or alternatively, the controller 55, 155, 255, 355A, 355B, 355C, 390 can be further configured to controllably operate the node outputs 36, 136, 236 based on such monitoring data and signals from the sensors 51, 52, 151, 152, 251, 252, 351A, 352A, 351B, 352B, 351C, 352C.

Still further, the controller 55, 155, 255, 355A, 355B, 355C, 390 can be controllably or communicatively coupled to another component, including, but not limited to, the second controller 45. For instance, in some implementations, the controller 55, 155, 255, 355A, 355B, 355C, 390 can be in signal communication with the second controller 45 and receive or provide signals, data, or the like, including aircraft data or load data in some implementations. Such data can be utilized by the controller 55, 155, 255, 355A, 355B, 355C, 390 in conjunction with signals from any of the sensors 51, 52, 151, 152, 251, 252, 351A, 352A, 351B, 352B, 351C, 352C to determine or enhance fault location or diagnostic capabilities. For instance, in one example of operation, the controller 55, 155, 255, 355A, 355B, 355C, 390 can determine a fault location in an electrical component, receive load data from the second controller 45 in the region of the electrical component, receive operational status data of the node outputs 36, 136, 236 in the region of the electrical component, and perform a validation of the determined fault location based on either or both of the load data or the operational status data. Such a validation can include confirming the fault presence, confirming the fault location, determining or updating a margin of error for the fault location, or the like. The controller 55, 155, 255, 355A, 355B, 355C, 390 can also transmit a signal indicative of the validation, such as a confidence interval or likelihood percentage in some non-limiting examples.

Figure 10:
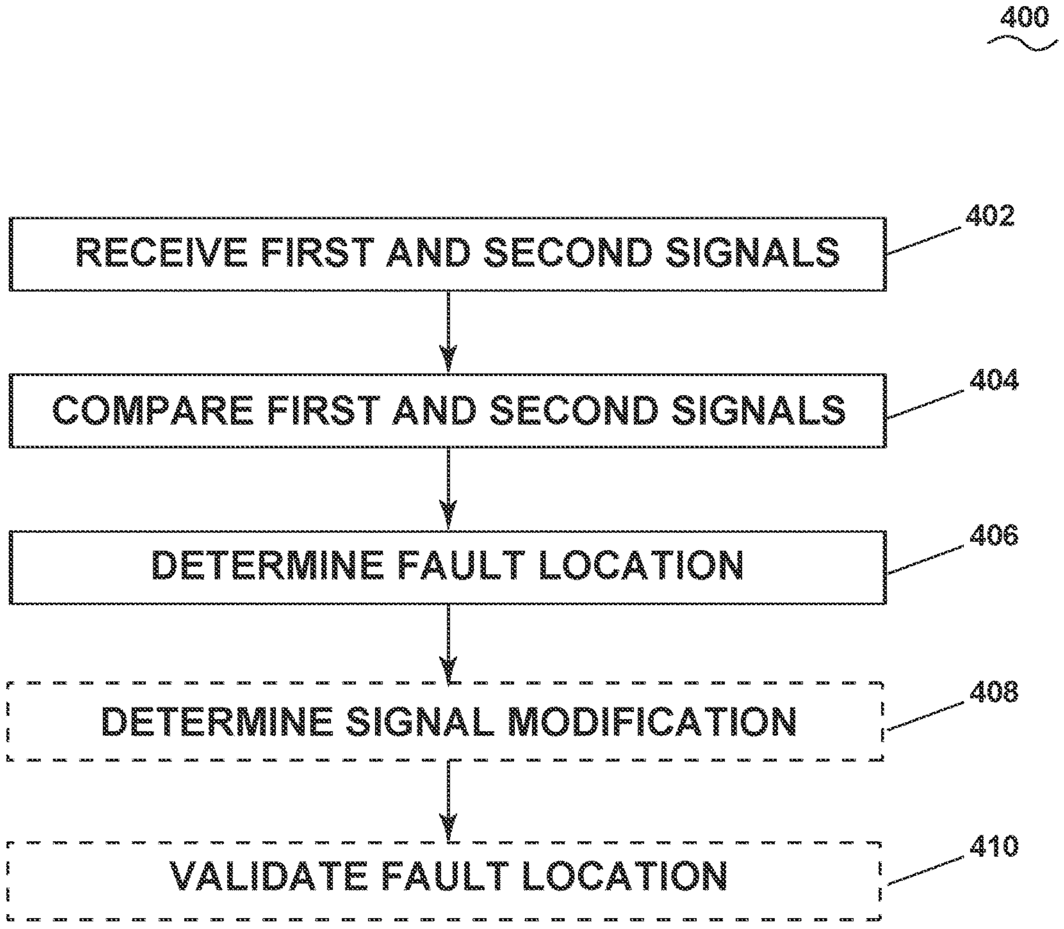
FIG. 10 is a flowchart illustrating a method of determining a location of an electrical fault in a component in accordance with various aspects described herein.

Turning to FIG. 10, a flowchart illustrates a method 400 of determining a location of an electrical fault in a component. The method 400 includes at 402 receiving, in a controller module having a processor and a machine-readable medium, such as the controller 55, 155, 255, 355A, 355B, 355C, 390, at least a first signal and a second signal from a first sensor and a second sensor, respectively, with the first signal and the second signal indicative of an incident electromagnetic pulse due to an electrical fault in the component. The first sensor can include the first sensor 51, 151, 251, 351A, 351B, 351C. The second sensor can include the second sensor 52, 152, 252, 352A, 352B, 352C.

The method 400 also includes at 404 comparing, by the controller module, the first signal and the second signal to determine a time delay, such as the time delay $\Delta T_A$, the subsequent time delay $\Delta T_B$, the first or second recurrent time intervals $\Delta T\mathbf{1}$, $\Delta T\mathbf{2}$, or a comparison of successive values for any or all of the time delay $\Delta T_A$, the subsequent time delay $\Delta T_B$, or the first or second recurrent time intervals $\Delta T\mathbf{1}$, $\Delta T\mathbf{2}$.

The method 400 also includes at 406 determining, by the controller module, a fault location of the electrical fault in the component based on the time delay, such as the fault location 75, 175, 275, 375.

Optionally, the method 400 can further include at 408 determining, by the controller, a signal modification by the filter for at least one of the first signal or the second signal as described above. Optionally, the method 400 can further include at 410 validating, by the controller, a determined fault location based on at least one of a subsequent first signal or a subsequent second signal as described above.

Many other possible aspects and configurations in addition to that shown in the above figures are contemplated by the present disclosure. The aspects disclosed herein provide a power distribution system and fault detection system operable in a dynamic-load state with multiple loads being switched on and off during operation. One technical effect is that the above-described aspects enable the power distribution system to be able to dynamically distribute and control power to a large number of electrical loads. Another technical effect is that the above-described aspects enable the fault detection system to be able to detect an arc fault in an electrical component, as well as provide an indication of the location of the arc fault within the electrical component.

Aspects of the disclosure provide for several benefits. Determination of a fault location within a component, including along one or multiple supply wires, bundles, or cables, provides for a more targeted system operation compared to traditional AFD systems providing only broad detection of an arc flash event. For instance, an operating circuit having the arc fault can still be selectively provided with power in such a way that avoids the fault location, e.g. a power controller switchably disconnecting the affected wire or portion while maintaining a supply of power to unaffected portions. Such fault-location determination also provides for more targeted maintenance operations, reducing time and costs involved in inspecting lengthy cable runs or the like.

In addition, aspects of the optical filter provide for improved controller discrimination between sensor signals corresponding to an arc flash event. For instance, the optical filter can remove ambient radiation traveling end-to-end through the optical conductor, thereby improving signal-to-noise ratios and providing more reliable detection of incident EM pulses. Signal modification by the optical filter, e.g. sharpening, widening, frequency-shifting, or the like, provides for additional improvements in controller discrimination between sensor signals for time delay or interval determinations.

Still further, incorporation of the fault detection system into an existing power distribution system component, e.g. a power distribution node, provides for a reduction in network complexity with additional time-saving or efficiency benefits for operation, configuration, or maintenance operations. In examples where the fault detection system is provided as an isolated or discrete system from the PDS, such an arrangement can provide for modular updating, configuration, or replacement of fault detection system components without affecting the existing PDS.

This written description uses examples to disclose embodiments of the disclosure, including the best mode, and also to enable any person skilled in the art to practice embodiments of the disclosure, including making and using any devices or systems and performing any incorporated methods. The patentable scope of the disclosure is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

Further aspects of the disclosure are provided by the subject matter of the following clauses:

A fault detection system for detecting an electrical fault in a component, the fault detection system comprising: an optical conductor comprising a first end and a second end and configured to optically face the component; a first sensor and a second sensor operably coupled to the first end and the second end, respectively, and each configured to detect electromagnetic (EM) radiation propagating within the optical conductor; and a controller module communicatively coupled to the first sensor and the second sensor; wherein, when an electrical fault in the component generates an incident EM pulse on the optical conductor, the controller module is configured to determine a fault location of the electrical fault in the component, and to provide an output indicating the fault location.

The fault detection system of any preceding clause, wherein the controller module is further configured to: receive a first signal from the first sensor indicative of the incident EM pulse propagating through the optical conductor toward the first end; receive a second signal from the second sensor indicative of the incident EM pulse propagating through the optical conductor toward the second end; determine a time delay between the first signal and the second signal; and determine the fault location based on the time delay.

The fault detection system of any preceding clause, wherein the controller module is further configured to determine a pulse location of the incident EM pulse on the optical conductor based on the time delay.

The fault detection system of any preceding clause, wherein the component comprises a supply wire configured to connect a power source to an electrical load, and wherein the optical conductor is configured to extend in a direction at least partially aligned with the supply wire.

The fault detection system of any preceding clause, wherein the fault location comprises at least one of a single position or a range of positions along the supply wire.

The fault detection system of any preceding clause, further comprising a bundle with multiple supply wires and having the supply wire.

The fault detection system of any preceding clause, wherein the fault location comprises an identification of the supply wire in the multiple supply wires having the electrical fault.

The fault detection system of any preceding clause, wherein the optical conductor, the first sensor, the second sensor, and the controller module collectively define a fault detection module.

The fault detection system of any preceding clause, wherein the fault detection system comprises multiple fault detection modules each configured to determine a fault location of an electrical fault in corresponding multiple supply wires.

The fault detection system of any preceding clause, further comprising a system controller module in signal communication with the multiple fault detection modules.

The fault detection system of any preceding clause, wherein the system controller module is configured to: receive a set of first signals from a first fault detection module indicative of an incident EM pulse on a first optical conductor; receive a set of second signals from a second fault detection module indicative of an EM pulse on a second optical conductor; compare the set of first signals with the set of second signals; and determine a relationship between the set of first signals and the set of second signals based on the comparison.

The fault detection system of any preceding clause, wherein the relationship comprises a dependence condition wherein the set of first signals and the set of second signals correspond to a common electrical fault.

The fault detection system of any preceding clause, wherein the relationship comprises an independence condition wherein the set of first signals and the set of second signals correspond to separate electrical faults.

The fault detection system of any preceding clause, further comprising at least one optical filter operably coupled to the optical conductor and configured to filter EM waves transmitted through the optical conductor between the first and second ends.

The fault detection system of any preceding clause, wherein the at least one optical filter comprises at least one of: a bandpass filter coupled to the optical conductor at a location between the first and second ends, a fiber Bragg grating extending along at least a first portion of the optical conductor, or an optical coating on at least a second portion of the optical conductor.

The fault detection system of any preceding clause, wherein the optical conductor comprises a fiber optic cable configured to form a loop about at least a portion of the component.

The fault detection system of any preceding clause, wherein the output comprises at least one of a visual output, an audio output, a display output, a tactile output, a text log entry, or a maintenance request.

The fault detection system of any preceding clause, wherein at least one of the first sensor or the second sensor comprises an ultraviolet sensor.

The fault detection system of any preceding clause, wherein the controller module is further configured to determine a signal modification by the optical filter for at least one of the first signal or the second signal.

A power distribution system for supplying electrical power to at least one electrical load, comprising: a power distribution node comprising a node input configured to receive electrical power from at least one power source, and a node output configured to provide electrical power; a supply wire electrically coupled to the node output and configured to supply electrical power from the node output to the at least one electrical load; and a fault detection system, comprising: an optical conductor comprising a first end and a second end and extending in a direction at least partially aligned with the supply wire; and a first sensor operably coupled to the first end, and a second sensor operably coupled to the second end, wherein the first sensor and the second sensor are each configured to detect electromagnetic (EM) radiation within the optical conductor; and a controller module communicatively coupled with the first sensor and the second sensor; wherein, when an electrical fault in the supply wire generates an incident EM pulse on the optical conductor, the controller module is configured to determine a fault location of the electrical fault in the supply wire, and to provide an output indicating the fault location.

The power distribution system of any preceding clause, wherein the controller module is further configured to: receive a first signal from the first sensor indicative of the incident EM pulse propagating through the optical conductor toward the first end; receive a second signal from the second sensor indicative of the incident EM pulse propagating through the optical conductor toward the second end; determine a time delay between the first signal and the second signal; and determine the fault location based on the time delay.

The power distribution system of any preceding clause, further comprising a bundle with multiple supply wires and having the supply wire, wherein the fault location comprises an identification of the supply wire in the bundle having the electrical fault.

The power distribution system of any preceding clause, wherein the optical conductor, the first sensor, the second sensor, and the controller module collectively define a fault detection module.

The power distribution system of any preceding clause, wherein the fault detection system comprises multiple fault detection modules each configured to determine a fault location of an electrical fault in corresponding multiple supply wires.

The power distribution system of any preceding clause, further comprising a system controller module in signal communication with the multiple fault detection modules, wherein the system controller module is configured to: receive a set of first signals from a first fault detection module indicative of an incident EM pulse on a first optical conductor; receive a set of second signals from a second fault detection module indicative of an EM pulse on a second optical conductor; compare the set of first signals with the set of second signals; and determine a relationship between the set of first signals and the set of second signals based on the comparison.

The power distribution system of any preceding clause, wherein the relationship comprises a dependence condition wherein the set of first signals and the set of second signals correspond to a common electrical fault.

The power distribution system of any preceding clause, wherein the relationship comprises an independence condition wherein the set of first signals and the set of second signals correspond to separate electrical faults.

The power distribution system of any preceding clause, wherein the output comprises at least one of a visual output, an audio output, a display output, a tactile output, a text log entry, or a maintenance request.

The power distribution system of any preceding clause, further comprising a power controller configured to controllably operate the node output for selectively supplying power to the at least one electrical load based on the output.

The power distribution system of any preceding clause, wherein the power controller comprises the controller module.

The power distribution system of any preceding clause, further comprising an optical filter operably coupled to the optical conductor and configured to filter EM waves transmitted through the optical conductor between the first and second ends.

The power distribution system of any preceding clause, wherein the controller module is further configured to determine a signal modification by the optical filter for at least one of the first signal or the second signal.

The power distribution system of any preceding clause, wherein the optical conductor comprises a fiber optic cable configured to form a loop about at least a portion of the supply wire.

The power distribution system of any preceding clause, wherein at least one of the first sensor and the second sensor comprises an ultraviolet sensor.

The power distribution system of any preceding clause, wherein the controller module is further configured to determine a signal modification by the optical filter for at least one of the first signal or the second signal.

A method of determining a location of an electrical fault in a component, the method comprising: receiving, in a controller module having a processor and a machine-readable medium, at least a first signal and a second signal from a first sensor and a second sensor, respectively, with the first signal and the second signal indicative of an incident electromagnetic pulse due to an electrical fault in the component; comparing, by the controller module, the first signal and the second signal to determine a time delay; and determining, by the controller module, a fault location of the electrical fault in the component based on the time delay.

The method of any preceding clause, further comprising an optical conductor operably coupled to the first sensor and the second sensor, wherein the electrical fault generates the incident electromagnetic pulse on the optical conductor.

The method of any preceding clause, further comprising receiving, in the controller module, a subsequent first signal from the first sensor; comparing, by the controller module, the subsequent first signal and the first signal to determine a subsequent time delay; and validating, by the controller module, the fault location based on the subsequent time delay.

The method of any preceding clause, further comprising receiving, in the controller module, a subsequent second signal from the first sensor; comparing, by the controller module, the subsequent second signal and the second signal to determine a subsequent time delay; and validating, by the controller module, the fault location based on the subsequent time delay.

The method of any preceding clause, wherein each of the first signal and the second signal comprise a voltage waveform.

The method of any preceding clause, wherein the comparing the first signal and the second signal comprises comparing at least one signal characteristic of the first signal and the second signal.

The method of any preceding clause, wherein the comparing the first signal and the subsequent first signal comprises comparing at least one signal characteristic of the first signal and the subsequent first signal.

The method of any preceding clause, wherein the comparing the second signal and the subsequent second signal comprises comparing at least one signal characteristic of the second signal and the subsequent second signal.

The method of any preceding clause, wherein the at least one signal characteristic comprises at least one of an amplitude, a full-width-half-maximum (FWHM) value, a waveform, or a phase.

The method of any preceding clause, further comprising validating, by the controller, a determined fault location based on at least one of the subsequent first signal or the subsequent second signal.

The method of any preceding clause, further comprising forming, by an optical filter, a modified signal characteristic for at least one of the first signal or the second signal.

The method of any preceding clause, further comprising determining, by the controller, a signal modification by the filter for at least one of the first signal or the second signal.

The method of any preceding clause, wherein the first sensor, the second sensor, and the controller module at least partially define a fault detection module.

The method of any preceding clause, further comprising multiple fault detection modules each configured to determine a fault location of an electrical fault in corresponding multiple components.

The method of any preceding clause, further comprising: receiving, by the controller module, a set of first signals from a first fault detection module indicative of an incident EM pulse on a first optical conductor; receiving, by the controller module, a set of second signals from a second fault detection module indicative of an EM pulse on a second optical conductor; comparing the set of first signals with the set of second signals; and determining a relationship between the set of first signals and the set of second signals based on the comparison.

The method of any preceding clause, wherein the relationship comprises a dependence condition wherein the set of first signals and the set of second signals correspond to a common electrical fault.

The method of any preceding clause, wherein the relationship comprises an independence condition wherein the set of first signals and the set of second signals correspond to separate electrical faults.

What is claimed is:

1. A fault detection system for detecting an electrical fault in a component, the fault detection system comprising:

an optical conductor comprising a first end and a second end and configured to optically face a supply wire of the component;

a first sensor and a second sensor operably coupled to the first end and the second end, respectively, each of the first sensor and the second sensor configured to detect electromagnetic (EM) radiation propagating within the optical conductor; and a controller module communicatively coupled to the first sensor and the second sensor;

wherein, when an electrical fault in the component generates an incident EM pulse on the optical conductor, the controller module is configured to:

determine a time delay between a plurality of signals received from the first sensor and the second sensor;

retrieve, from a memory, a predetermined spacing distance between the supply wire and the optical conductor;

determine a fault location of the electrical fault in the supply wire of the component based at least in part on the time delay and the predetermined spacing distance; and provide an output indicating the fault location in the supply wire of the component.

2. The fault detection system of claim 1, wherein the controller module is further configured to:

receive a first signal from the first sensor indicative of the incident EM pulse propagating through the optical conductor toward the first end; and receive a second signal from the second sensor indicative of the incident EM pulse propagating through the optical conductor toward the second end.

3. The fault detection system of claim 1, wherein the component comprises the supply wire configured to connect a power source to an electrical load, and wherein the optical conductor is configured to extend in a direction at least partially aligned with the supply wire.

4. The fault detection system of claim 3, wherein the fault location comprises at least one of a single position or a range of positions along the supply wire.

5. The fault detection system of claim 4, further comprising a bundle with multiple supply wires and having the supply wire.

6. The fault detection system of claim 1, wherein the optical conductor, the first sensor, the second sensor, and the controller module collectively define a fault detection module, and wherein the fault detection system comprises multiple fault detection modules each configured to determine a respective fault location of a respective electrical fault in corresponding multiple supply wires.

7. The fault detection system of claim 6, further comprising a system controller module in signal communication with the multiple fault detection modules, wherein the system controller module is configured to:

receive a set of first signals from a first fault detection module indicative of an incident EM pulse on a first optical conductor;

receive a set of second signals from a second fault detection module indicative of an EM pulse on a second optical conductor;

compare the set of first signals with the set of second signals; and determine a relationship between the set of first signals and the set of second signals based on the comparison.

8. The fault detection system of claim 1, further comprising at least one optical filter operably coupled to the optical conductor and configured to filter EM waves transmitted through the optical conductor between the first and second ends.

9. The fault detection system of claim 8, wherein the at least one optical filter comprises at least one of:

a bandpass filter coupled to the optical conductor at a location between the first and second ends, a fiber Bragg grating extending along at least a first portion of the optical conductor, or an optical coating on at least a second portion of the optical conductor.

10. The fault detection system of claim 1, wherein the optical conductor comprises a fiber optic cable configured to form a loop about at least a portion of the component.

11. A power distribution system for supplying electrical power to at least one electrical load, comprising:

a power distribution node comprising a node input configured to receive electrical power from at least one power source, and a node output configured to provide electrical power;

a supply wire electrically coupled to the node output and configured to supply electrical power from the node output to the at least one electrical load; and a fault detection system, comprising:

an optical conductor comprising a first end and a second end and extending in a direction at least partially aligned with the supply wire; and a first sensor operably coupled to the first end, and a second sensor operably coupled to the second end, wherein the first sensor and the second sensor are each configured to detect electromagnetic (EM) radiation within the optical conductor; and a controller module communicatively coupled with the first sensor and the second sensor;

wherein, when an electrical fault in the supply wire generates an incident EM pulse on the optical conductor, the controller module is configured to:

retrieve, from a memory, a predetermined spacing distance between the supply wire and the optical conductor;

determine a fault location of the electrical fault in the supply wire based at least in part on a time delay between a plurality of signals received from the first sensor and the second sensor and the predetermined spacing distance; and provide an output indicating the fault location.

12. The power distribution system of claim 11, wherein the controller module is further configured to:

receive a first signal from the first sensor indicative of the incident EM pulse propagating through the optical conductor toward the first end; and receive a second signal from the second sensor indicative of the incident EM pulse propagating through the optical conductor toward the second end.

13. The power distribution system of claim 11, further comprising a bundle with multiple supply wires and having the supply wire, wherein the fault location comprises an identification of the supply wire in the bundle having the electrical fault.

14. The power distribution system of claim 11, wherein the optical conductor, the first sensor, the second sensor, and the controller module collectively define a fault detection module, and wherein the fault detection system comprises multiple fault detection modules each configured to determine a fault location of an electrical fault in corresponding multiple supply wires.

15. The power distribution system of claim 14, further comprising a system controller module in signal communication with the multiple fault detection modules, wherein the system controller module is configured to:

receive a set of first signals from a first fault detection module indicative of an incident EM pulse on a first optical conductor;

receive a set of second signals from a second fault detection module indicative of an EM pulse on a second optical conductor;

compare the set of first signals with the set of second signals; and determine a relationship between the set of first signals and the set of second signals based on the comparison.

16. The power distribution system of claim 11, wherein the controller module further comprises a power controller configured to controllably operate the node output for selectively supplying power to the at least one electrical load based on the output.

17. The power distribution system of claim 12, further comprising an optical filter operably coupled to the optical conductor and configured to filter EM waves transmitted through the optical conductor between the first and second ends.

18. The power distribution system of claim 17, wherein the controller module is further configured to determine a signal modification by the optical filter for at least one of the first signal or the second signal.

19. A method of determining a location of an electrical fault in a component, the method comprising:

receiving, in a controller module having a processor and a machine-readable medium, at least a first signal and a second signal from a first sensor and a second sensor, respectively, with the first signal and the second signal indicative of an incident electromagnetic pulse due to an electrical fault in at least one supply wire of the component;

comparing, by the controller module, the first signal and the second signal to determine a time delay;

retrieving, by the controller module, a predetermined spacing distance between the at least one supply wire and an optical conductor, the predetermined spacing distance being retrieved from a memory; and determining, by the controller module, a fault location of the electrical fault in the component based at least in part on the time delay and the predetermined spacing distance.

20. The fault detection system of claim 1, further comprising an optical filter operably coupled to the optical conductor, and the controller module is configured to:

determine a signal modification by the optical filter for the plurality of signals; and validate the fault location based at least in part on a plurality of subsequent signals.

* * * * *